(12) United States Patent
Jang et al.

(10) Patent No.: US 10,454,618 B2
(45) Date of Patent: Oct. 22, 2019

(54) APPARATUS AND METHOD FOR TRANSMITTING AND RECEIVING SIGNAL IN COMMUNICATION SYSTEM SUPPORTING RATE COMPATIBLE LOW DENSITY PARITY CHECK CODE

(71) Applicant: Samsung Electronics Co., Ltd., Suwon-si, Gyeonggi-do (KR)

(72) Inventors: Min Jang, Seongnam-si (KR); Seok-Ki Ahn, Suwon-si (KR); Chi-Woo Lim, Suwon-si (KR); Jae-Yoel Kim, Seongnam-si (KR); Woo-Myoung Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 414 days.

(21) Appl. No.: 15/400,304

(22) Filed: Jan. 6, 2017

(65) Prior Publication Data
US 2017/0201348 A1 Jul. 13, 2017

(30) Foreign Application Priority Data
Jan. 8, 2016 (KR) .................. 10-2016-0002893

(51) Int. Cl.
*H04L 1/00* (2006.01)
*H03M 13/11* (2006.01)
(Continued)

(52) U.S. Cl.
CPC ........ *H04L 1/0068* (2013.01); *H03M 13/036* (2013.01); *H03M 13/116* (2013.01);
(Continued)

(58) Field of Classification Search
CPC ....... H04L 1/0068; H04L 1/08; H04L 1/0009; H04L 1/1819; H03M 13/116;
(Continued)

(56) References Cited

U.S. PATENT DOCUMENTS

| 8,239,746 B2 | 8/2012 | Divsalar et al. |
| 2006/0059401 A1 | 3/2006 | Ko |

(Continued)

FOREIGN PATENT DOCUMENTS

| EP | 2 091 171 A2 | 8/2009 |
| KR | 10-2009-0113869 A | 11/2009 |
| KR | 10-2015-0040740 A | 4/2015 |

OTHER PUBLICATIONS

Wenwen Li et al., "Novel Extending Scheme for the Construction of Rate-Compatible IRA-like Codes", College of Electronic Science and Engineering, Changsha, China, XP055374699, published on 2005 IEEE.

(Continued)

*Primary Examiner* — Thien Nguyen
(74) *Attorney, Agent, or Firm* — Jefferson IP Law, LLP

(57) ABSTRACT

The present disclosure relates to a pre-5th-generation (5G) or 5G communication system to be provided for supporting higher data rates beyond 4th-generation (4G) communication system such as a long term evolution (LTE). A method and apparatus for transmitting a signal in a transmitting apparatus in a communication system supporting a rate compatible-low density parity check (RC-LDPC) code are provided. The method includes encoding information bits based on a first parity check matrix and a first code rate to generate a codeword, processing the codeword to generate a transmission signal, and transmitting the transmission signal.

20 Claims, 10 Drawing Sheets

(51) Int. Cl.
*H03M 13/00* (2006.01)
*H04L 1/08* (2006.01)
*H03M 13/03* (2006.01)
*H04L 1/18* (2006.01)

(52) U.S. Cl.
CPC .... *H03M 13/1148* (2013.01); *H03M 13/1168* (2013.01); *H03M 13/1185* (2013.01); *H03M 13/616* (2013.01); *H03M 13/618* (2013.01); *H03M 13/6393* (2013.01); *H04L 1/08* (2013.01); *H04L 1/0009* (2013.01); *H04L 1/1819* (2013.01)

(58) Field of Classification Search
CPC ........... H03M 13/036; H03M 13/1168; H03M 13/6393; H03M 13/618; H03M 13/1185; H03M 13/1148; H03M 13/616
See application file for complete search history.

(56) References Cited

U.S. PATENT DOCUMENTS

| | | |
|---|---|---|
| 2007/0022362 A1 | 1/2007 | Yue et al. |
| 2008/0178065 A1 | 7/2008 | Khandekar et al. |
| 2009/0249157 A1 | 10/2009 | Lee et al. |
| 2009/0313520 A1* | 12/2009 | Chung ................. H03M 13/116 714/751 |
| 2015/0100844 A1 | 4/2015 | Park et al. |

OTHER PUBLICATIONS

David Benmayor et al., "Rate-Compatible Irregular Repeat-Accumulate Codes for DVB-SH Applications", Institute for Space Applications and Remote Sensing, Athens, Greece, XP031352183, Published on 2008 IEEE.
European Search Report dated Nov. 27, 2018, issued in European Patent Application No. 17736138.3.
Tsung-Yi Chen et al., "Protograph-Based Raptor-Like LDPC Codes", May 2015, pp. 1-12.

* cited by examiner

APPARATUS AND METHOD FOR TRANSMITTING AND RECEIVING SIGNAL IN COMMUNICATION SYSTEM SUPPORTING RATE COMPATIBLE LOW DENSITY PARITY CHECK CODE

CROSS-REFERENCE TO RELATED APPLICATION(S)

This application claims the benefit under 35 U.S.C. § 119(a) of a Korean patent application filed on Jan. 8, 2016 in the Korean Intellectual Property Office and assigned Serial number 10-2016-0002893, the entire disclosure of which is hereby incorporated by reference.

TECHNICAL FIELD

The present disclosure relates to an apparatus and method for transmitting and receiving a signal in a communication system supporting a low density parity check (LDPC) code. More particularly, the present disclosure relates to an apparatus and method for transmitting and receiving a signal in a communication system supporting a rate compatible-LDPC (RC-LDPC) code.

BACKGROUND

To meet the demand for wireless data traffic, which has increased since deployment of 4th-generation (4G) communication systems, efforts have been made to develop an improved 5th-generation (5G) or pre-5G communication system. Therefore, the 5G or pre-5G communication system is also called a 'beyond 4G network' or a 'post long-term evolution (LTE) system'.

It is considered that the 5G communication system will be implemented in millimeter wave (mmWave) bands, e.g., 60 GHz bands, so as to accomplish higher data rates. To reduce propagation loss of radio waves and increase a transmission distance, a beam forming technique, a massive multiple-input multiple-output (MIMO) technique, a full dimensional MIMO (FD-MIMO) technique, an array antenna technique, an analog beam forming technique, and a large scale antenna technique are discussed in 5G communication systems.

In addition, in 5G communication systems, development for system network improvement is under way based on advanced small cells, cloud radio access networks (RANs), ultra-dense networks, a device-to-device (D2D) communication, a wireless backhaul, a moving network, a cooperative communication, coordinated multi-points (CoMP), reception-end interference cancellation, and the like.

In the 5G system, a hybrid frequency shift keying (FSK) and quadrature amplitude modulation (QAM) modulation (FQAM) and a sliding window superposition coding (SWSC) as an advanced coding modulation (ACM) scheme, and a filter bank multi carrier (FBMC) scheme, a non-orthogonal multiple access (NOMA) scheme, and a sparse code multiple access (SCMA) scheme as an advanced access technology have been developed.

Firstly, various channel codes have been used in a communication system, and a typical one is a low density parity check (LDPC) code.

The LDPC code is an error correction code of which an encoding and decoding complexity is really implementable and a performance approaches a theoretical channel capacity. The LDPC code may be designed thereby being suitable for parallel processing and an error correction performance of the LDPC code on a channel is good, so the LDPC code has been used in various communication systems such as an institute of electrical and electronics engineers (IEEE) 802.11n/ad Wi-Fi communication system, an IEEE 802.16e worldwide interoperability for microwave access (WiMAX) communication system, a digital video broadcasting-satellite-second generation (DVB-S2) communication system which is based on a second generation DVB-S2 standard, a DVB-terrestrial-second generation (DVB-T2) communication system which is based on a second generation DVB-T2 standard, a DVB-cable-second generation (DVB-C2) communication system which is based on a second generation DVB-C2 standard, an advanced television system committee (ATSC) 3.0 communication system which is based on an ATSC 3.0 standard, a G.hn communication system which is based on a G.hn standard as a home network standard, and/or the like.

Meanwhile, a binary LDPC code may be defined based on a parity check matrix including elements which have a value '1' and elements which have a value '0'. The number of rows and the number of columns included in the parity check matrix may be expressed as N and M, respectively. In a case that the LDPC code which may be defined based on the parity check matrix is used, message bits of a length K are generated as codeword bits of a length N. Here, K=N−M.

The LDPC code is a typical block code. The block code is generally designed thereby supporting a one fixed code rate. If necessary, a signal transmitting apparatus performs a puncturing operation on a codeword generated based on an LDPC code supporting the one fixed code rate to acquire a target code rate. In a case that the signal transmitting apparatus generates a codeword by performing a simple puncturing operation to adjust a code rate, a performance of the generated codeword is significantly degraded compared to a codeword generated based on an LDPC code designed thereby being suitable for an original code rate.

If a communication system needs to maintain a performance and support various code rates, it may be a simple solution to directly design and use LDPC codes suitable for the code rates which the communication system needs to support. However, it may be a significant hardware load to a signal transmitting apparatus and a signal receiving apparatus to design all of LDPC codes of which the number is equal to the number of code rates which the communication system needs to support, to store parity check matrixes which correspond to the designed LDPC codes, and to use the parity check matrixes.

Study for a rate compatible (RC)-LDPC code for solving this issue has been continuously progressed by various study groups. The RC-LDPC code is an LDPC code which may support various code rates with one structure. Upon using the RC-LDPC code, a signal transmitting apparatus may effectively generate codewords for supporting various code rates through a puncturing operation. The signal transmitting apparatus may support an incremental redundancy-hybrid automatic retransmission request (IR-HARQ) scheme using this RC-LDPC code.

In a case that an RC-LDPC code is designed, an LDPC code with the highest code rate is fixed, and an LDPC code with a low code rate is repetitively generated. The lower a code rate is, the more degraded a performance of a codeword generated based on an RC-LDPC code is.

However, RC-LDPC codes proposed up to now are designed for supporting various code rates without considering performance degradation of a codeword due to decrease of a code rate.

The performance degradation of the codeword due to decrease of the code rate as described above in a communication system supporting an RC-LDPC code degrades total system performance. That is, the RC-LDPC code may not provide a good performance for all code rates, so a link adaptation scheme which is based on the RC-LDPC code may not provide a good performance. A performance of an IR-HARQ scheme is significantly affected by a performance of a code rate applied to initial transmission which is based on channel quality, the RC-LDPC code may not provide a good performance for all code rates, so a performance of an IR-HARQ scheme is also degraded when the RC-LDPC code is used.

As described above, in a case that an RC-LDPC code is used, a good performance may not be guaranteed for all code rates. Due to this, total system performance and stability of a communication system are degraded.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an apparatus and method for transmitting and receiving a signal in a communication system supporting a rate compatible-low density parity check (RC-LDPC) code.

Another aspect of the present disclosure is to provide an apparatus and method for transmitting and receiving a signal thereby enhancing a performance for various code rates in a communication system supporting an RC-LDPC code.

Another aspect of the present disclosure is to provide an apparatus and method for designing an RC-LDPC code thereby guaranteeing a performance for various code rates in a communication system supporting an RC-LDPC code.

Another aspect of the present disclosure is to provide an apparatus and method for designing a parity check matrix of an RC-LDPC code thereby guaranteeing a performance for various code rates in a communication system supporting an RC-LDPC code.

Another aspect of the present disclosure is to provide an apparatus and method for transmitting and receiving a signal thereby increasing efficiency of a link adaptation scheme in a communication system supporting an RC-LDPC code.

Another aspect of the present disclosure is to provide an apparatus and method for transmitting and receiving a signal thereby increasing efficiency of an incremental redundancy-hybrid automatic retransmission request (IR-HARQ) scheme in a communication system supporting an RC-LDPC code.

In accordance with an aspect of the present disclosure, a method for transmitting a signal in a transmitting apparatus in a communication system supporting an RC-LDPC code is provided. The method includes encoding information bits based on a first parity check matrix and a first code rate to generate a codeword, processing the codeword to generate a transmission signal, and transmitting the transmission signal, wherein the first parity check matrix includes a second parity check matrix supporting a second code rate, a third parity check matrix supporting a third code rate, a sub-matrix used for concatenating the second parity check matrix and the third parity check matrix, and a fourth parity check matrix shared with the second parity check matrix, the third parity check matrix, and the sub-matrix, and wherein the fourth parity check matrix is a parity check matrix supporting a maximum code rate among code rates supported in the communication system.

In accordance with another aspect of the present disclosure, a method for receiving a signal in a receiving apparatus in a communication system supporting an RC-LDPC code is provided. The method includes receiving a signal from a transmitting apparatus and performing a decoding of the signal corresponding to a first parity check matrix and a first code rate used in the transmitting apparatus, wherein the first parity check matrix includes a second parity check matrix supporting a second code rate, a third parity check matrix supporting a third code rate, a sub-matrix used for concatenating the second parity check matrix and the third parity check matrix, and a fourth parity check matrix shared with the second parity check matrix, the third parity check matrix, and the sub-matrix, and wherein the fourth parity check matrix is a parity check matrix supporting a maximum code rate among code rates supported in the communication system.

In accordance with another aspect of the present disclosure, a transmitting apparatus in a communication system supporting an RC-LDPC code is provided. The transmitting apparatus includes a processor configured to perform encoding of information bits based on a first parity check matrix and a first code rate to generate a codeword, processing of the codeword to generate a transmission signal, and transmitting of the transmission signal, wherein the first parity check matrix includes a second parity check matrix supporting a second code rate, a third parity check matrix supporting a third code rate, a sub-matrix used for concatenating the second parity check matrix and the third parity check matrix, and a fourth parity check matrix shared with the second parity check matrix, the third parity check matrix, and the sub-matrix, and wherein the fourth parity check matrix is a parity check matrix supporting a maximum code rate among code rates supported in the communication system.

In accordance with another aspect of the present disclosure, a receiving apparatus in a communication system supporting an RC-LDPC code is provided. The receiving apparatus includes a processor configured to perform receiving of a signal from a transmitting apparatus, and a decoding of the signal corresponding to a first parity check matrix and a first code rate used in the transmitting apparatus, wherein the first parity check matrix includes a second parity check matrix supporting a second code rate, a third parity check matrix supporting a third code rate, a sub-matrix used for concatenating the second parity check matrix and the third parity check matrix, and a fourth parity check matrix shared with the second parity check matrix, the third parity check matrix, and the sub-matrix, and wherein the fourth parity check matrix is a parity check matrix supporting a maximum code rate among code rates supported in the communication system.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 1 schematically illustrates an example of a base matrix of a rate compatible-low density parity check (RC-LDPC) code in a communication system according to an embodiment of the present disclosure;

FIG. 4 schematically illustrates an example of a parity check matrix $H_k$ of an RC-LDPC code in a communication system according to an embodiment of the present disclosure;

Throughout the drawings, it should be noted that like reference numbers are used to depict the same or similar elements, features, and structures.

DETAILED DESCRIPTION

Figure 2:
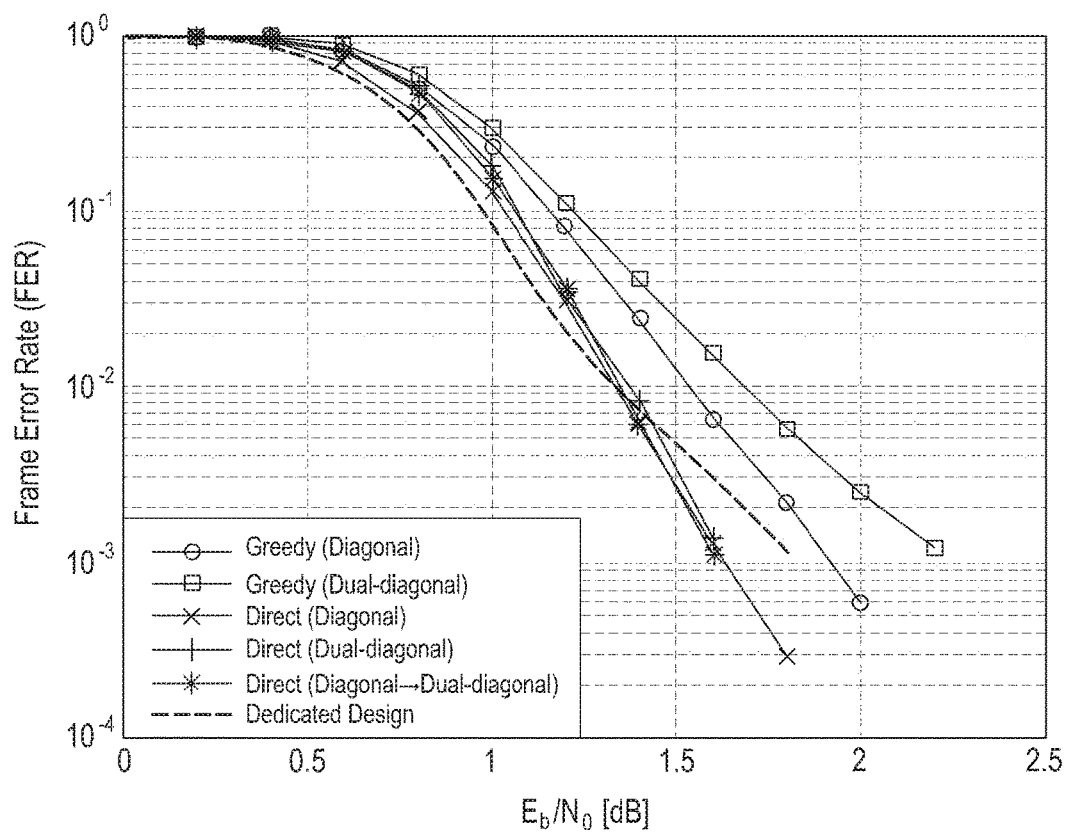
FIG. 2 schematically illustrates performances of LDPC codes which are designed based on different schemes in a communication system according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Although ordinal numbers such as "first," "second," and so forth will be used to describe various components, those components are not limited herein. The terms are used only for distinguishing one component from another component. For example, a first component may be referred to as a second component and likewise, a second component may also be referred to as a first component, without departing from the teaching of the inventive concept. The term "and/or" used herein includes any and all combinations of one or more of the associated listed items.

It will be further understood that the terms "comprises" and/or "has," when used in this specification, specify the presence of a stated feature, number, operation, component, element, or combination thereof, but do not preclude the presence or addition of one or more other features, numbers, operations, components, elements, or combinations thereof.

The terms used herein, including technical and scientific terms, have the same meanings as terms that are generally understood by those skilled in the art, as long as the terms are not differently defined. It should be understood that terms defined in a generally-used dictionary have meanings coinciding with those of terms in the related technology.

According to various embodiments of the present disclosure, an electronic device may include communication functionality. For example, an electronic device may be a smart phone, a tablet personal computer (PC), a mobile phone, a video phone, an e-book reader, a desktop PC, a laptop PC, a netbook PC, a personal digital assistant (PDA), a portable multimedia player (PMP), a Moving Picture Experts Group phase 1 or phase 2 (MPEG-1 or MPEG-2) audio layer 3 (mp3) player, a mobile medical device, a camera, a wearable device (e.g., a head-mounted device (HMD), electronic clothes, electronic braces, an electronic necklace, an electronic appcessory, an electronic tattoo, or a smart watch), and/or the like.

According to various embodiments of the present disclosure, an electronic device may be a smart home appliance with communication functionality. A smart home appliance may be, for example, a television (TV), a digital versatile disc (DVD) player, an audio, a refrigerator, an air conditioner, a vacuum cleaner, an oven, a microwave oven, a washer, a dryer, an air purifier, a set-top box, a TV box (e.g., Samsung HomeSync™, Apple TV™, or Google TV™), a gaming console, an electronic dictionary, an electronic key, a camcorder, an electronic picture frame, and/or the like.

According to various embodiments of the present disclosure, an electronic device may be a medical device (e.g., magnetic resonance angiography (MRA) device, a magnetic resonance imaging (MRI) device, computed tomography (CT) device, an imaging device, or an ultrasonic device), a navigation device, a global positioning system (GPS) receiver, an event data recorder (EDR), a flight data recorder (FDR), an automotive infotainment device, a naval electronic device (e.g., naval navigation device, gyroscope, or compass), an avionic electronic device, a security device, an industrial or consumer robot, and/or the like.

According to various embodiments of the present disclosure, an electronic device may be furniture, part of a building/structure, an electronic board, electronic signature receiving device, a projector, various measuring devices (e.g., water, electricity, gas or electro-magnetic wave measuring devices), and/or the like that include communication functionality.

According to various embodiments of the present disclosure, an electronic device may be any combination of the foregoing devices. In addition, it will be apparent to one having ordinary skill in the art that an electronic device according to various embodiments of the present disclosure is not limited to the foregoing devices.

According to various embodiments of the present disclosure, for example, a signal transmitting apparatus or a signal receiving apparatus may be a user equipment (UE).

According to various embodiments of the present disclosure, for example, a signal transmitting apparatus or a signal receiving apparatus may be an evolved node B (eNB).

According to various embodiments of the present disclosure, the term signal transmitting apparatus may be interchangeable with the term transmitting apparatus, and/or the like, and the term signal receiving apparatus may be interchangeable with the term receiving apparatus, and/or the like.

According to various embodiments of the present disclosure, the term UE may be interchangeable with the term terminal, device, mobile station (MS), mobile device, subscriber station, and/or the like.

According to various embodiments of the present disclosure, the term eNB may be interchangeable with the term base station (BS), access point (AP), and/or the like.

An embodiment of the present disclosure proposes an apparatus and method for transmitting and receiving a signal in a communication system supporting a rate compatible-low density parity check (RC-LDPC) code.

An embodiment of the present disclosure proposes an apparatus and method for transmitting and receiving a signal thereby enhancing a performance for various code rates in a communication system supporting an RC-LDPC code.

An embodiment of the present disclosure proposes an apparatus and method for designing an RC-LDPC code thereby guaranteeing a performance for various code rates in a communication system supporting an RC-LDPC code. In various embodiments of the present disclosure, the term design may be interchangeable with the term generation, implementation, and/or the like.

An embodiment of the present disclosure proposes an apparatus and method for designing a parity check matrix of an RC-LDPC code thereby guaranteeing a performance for various code rates in a communication system supporting an RC-LDPC code.

An embodiment of the present disclosure proposes an apparatus and method for transmitting and receiving a signal thereby increasing efficiency of a link adaptation scheme in a communication system supporting an RC-LDPC code.

An embodiment of the present disclosure proposes an apparatus and method for transmitting and receiving a signal thereby increasing efficiency of an incremental redundancy-hybrid automatic retransmission request (IR-HARQ) scheme in a communication system supporting an RC-LDPC code.

An apparatus and method proposed in various embodiments of the present disclosure may be applied to various communication systems such as a long term evolution (LTE) mobile communication system, an LTE-advanced (LTE-A) mobile communication system, a licensed-assisted access (LAA)-LTE mobile communication system, a high speed downlink packet access (HSDPA) mobile communication system, a high speed uplink packet access (HSUPA) mobile communication system, a high rate packet data (HRPD) mobile communication system proposed in a $3^{rd}$ generation project partnership 2 (3GPP2), a wideband code division multiple access (WCDMA) mobile communication system proposed in the 3GPP2, a CDMA mobile communication system proposed in the 3GPP2, an institute of electrical and electronics engineers (IEEE) 802.16m communication system, an IEEE 802.16e communication system, an evolved packet system (EPS), and a mobile internet protocol (Mobile IP) system, a digital video broadcast system such as a mobile broadcast service such as a digital multimedia broadcasting (DMB) service, a digital video broadcasting-handheld (DVB-H), an advanced television systems committee-mobile/handheld (ATSC-M/H) service, and the like, and an internet protocol television (IPTV), an MPEG media transport (MMT) system and/or the like.

Firstly, an RC-LDPC code will be described below.

A typical form of the RC-LDPC code is a form in which an LDPC code with a low code rate is concatenated to an LDPC code with the highest code rate which a communication system needs to support. Here, it will be assumed that the highest code rate which the communication system needs to support is $r_0$.

Meanwhile, a parity check matrix of an RC-LDPC code which has the form in which the LDPC code with the low code rate is concatenated to the LDPC code with the highest code rate which the communication system needs to support may be expressed as Equation 1.

$$H = \begin{bmatrix} H_0 & 0 \\ B & T \end{bmatrix} \quad \text{Equation 1}$$

In Equation 1, H denotes a parity check matrix of the RC-LDPC code, $H_0$ denotes a parity check matrix of an LDPC code with a code rate $r_0$ as the highest code rate, and 0 denotes a zero matrix.

A sub-matrix [B T] included in the parity check matrix H denotes a parity check matrix of the LDPC code with the low code rate which is concatenated to the LDPC code with the highest code rate. The low code rate indicates a code rate equal to or less than a preset threshold code rate.

A sub-matrix T is designed as a lower-triangular form for effective encoding, and is generally designed as an identity matrix for convenience and performance optimization. An RC-LDPC code of which a sub-matrix T is designed as an identity matrix will be referred to as "raptor-like LDPC code".

The RC-LDPC code is generated based on a greedy scheme according to a code rate to be supported. For example, code rates which a communication system intends to support are code rates $r_0$, $r_1$, and $r_2$ ($r_0 > r_1 > r_2$), an RC-LDPC code designer firstly designs a parity check matrix $H_0$ which has a performance optimized for the code rate $r_0$. The RC-LDPC code designer may be included in any device included in the communication system.

Then, the RC-LDPC code designer designs a parity check matrix $H_1$ of an LDPC code with the code rate $r_1$ as expressed in Equation 2.

$$H_1 = \begin{bmatrix} H_0 & 0 \\ B_1 & I \end{bmatrix}$$ Equation 2

As expressed in Equation 2, an extended parity part is generally fixed as an identity matrix I or a specific lower-triangular matrix, the design of the parity check matrix $H_1$ may be regarded as a design of a matrix $B_1$ in a state that a remaining part as well as a parity check matrix $H_0$ which has been designed already is fixed.

Like as the design of the parity check matrix $H_1$ of the LDPC code with the code rate $r_1$, a parity check matrix $H_2$ of an LDPC code with the code rate $r_2$ may be designed as expressed in Equation 3.

$$H_2 = \begin{bmatrix} H_1 & 0 \\ B_2 & I \end{bmatrix}$$ Equation 3

As described above, if the code rates which the communication system needs to supports are code rates $r_0$, $r_1$, . . . , $r_{min}$, a parity check matrix $H_{i+1}$ of an LDPC code with a code rate $r_{i+1}$ is designed in a state that a structure of a parity check matrix $H_i$ which has been designed before the parity check matrix $H_{i+1}$ is determined.

In view of this, the RC-LDPC code is designed based on a greedy scheme according to each code rate, so it may be regarded that local optimization for an LDPC code with each code rate is achieved.

Figure 1:
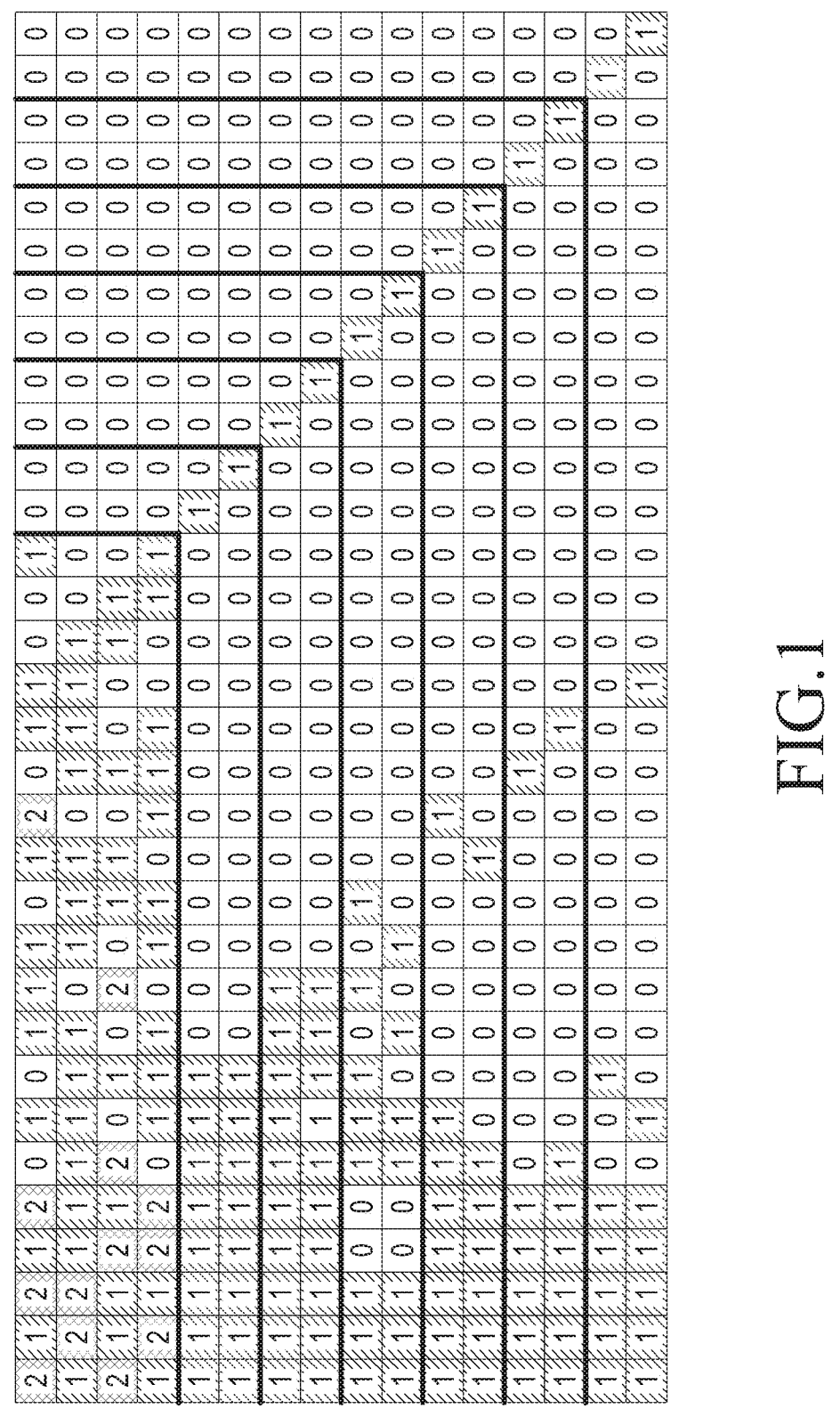

An example of a base matrix of an RC-LDPC code in a communication system according to an embodiment of the present disclosure will be described with reference to FIG. 1.

FIG. 1 schematically illustrates an example of a base matrix of an RC-LDPC code in a communication system according to an embodiment of the present disclosure.

Referring to FIG. 1, it will be noted that the term a base matrix may be interchangeable with the term proto-matrix.

In FIG. 1, a unit matrix of which a value is expressed as '0' among unit matrixes included in the base matrix indicates a zero matrix. A unit matrix of which a value is expressed as 'm', not '0', among the unit matrixes included in the base matrix indicates a unit matrix for which the number of edges connecting a variable node and a check node which correspond to each row and each column is m. For example, a unit matrix of which a value is expressed as '1' among the unit matrixes included in the base matrix indicates a matrix which is generated by cyclic-circulating an identity matrix by a predetermined value. For convenience, the predetermined value is not shown in FIG. 1.

As shown in FIG. 1, a parity part which may be extended in a parity check matrix is fixed as an identity matrix.

The RC-LDPC code is generally designed based on a greedy scheme. The greedy scheme is a scheme which enables local optimization for each stage, i.e., each code rate and does not guarantee global optimization.

In a case of designing the RC-LDPC code, an LDPC code with the highest code rate is fixed, LDPC codes with a code rate less than the highest code rate are repetitively generated. The lower a code rate is, the more degraded a performance of the RC-LDPC code is.

An example of a base matrix of an RC-LDPC code in a communication system according to an embodiment of the present disclosure has been described with reference to FIG. 1, and performances of LDPC codes which are designed based on different schemes in a communication system according to an embodiment of the present disclosure will be described with reference to FIG. 2.

FIG. 2 schematically illustrates performances of LDPC codes which are designed based on different schemes in a communication system according to an embodiment of the present disclosure.

Referring to FIG. 2, it will be noted that performances of LDPC codes in FIG. 2 are performances of LDPC codes generated by the following.

In FIG. 2, a vertical axis indicates a frame error rate (FER), and a horizontal axis indicates $E_s/N_o$.

Firstly, a parity check matrix $H_0$ with $r_0$, e.g., a code rate 8/10 as the highest code rate which the communication system needs to support is designed. Then, an RC-LDPC code is designed gradually, i.e., based on a greedy scheme with a scheme of extending each of an identity matrix and a dual-diagonal matrix from the parity check matrix $H_0$ for supporting code rates 8/11, 8/12, 8/13, 8/14, 8/15, and 8/16.

Further, an LDPC code with a code rate 8/16 is directly designed with a scheme of extending each of an identity matrix and a dual-diagonal matrix from an LDPC code which corresponds to the parity check matrix $H_0$.

Lastly, a dedicated LDPC code with a code rate 8/16 is designed without any restriction.

In FIG. 2, a graph marked as "Greedy(Diagonal)" indicates a performance of an RC-LDPC code which is designed by extending a diagonal matrix based on a greedy scheme, a graph marked as "Greedy(Dual-diagonal)" indicates a performance of an RC-LDPC code which is designed by extending a dual-diagonal matrix based on a greedy scheme, a graph marked as "Direct(Diagonal)" indicates a performance of an RC-LDPC code which is designed by extending a diagonal matrix based on a direct scheme, a graph marked as "Direct(Dual-diagonal)" indicates a performance of an RC-LDPC code which is designed by extending a dual-diagonal matrix based on a direct scheme, a graph marked as "Direct(Diagonal→Dual-diagonal)" indicates a performance of an RC-LDPC code which is designed by extending a diagonal matrix and a dual-diagonal matrix based on a direct scheme, and a graph marked as "Dedicated Design" indicates a performance of an RC-LDPC code which is directly designed.

As shown in FIG. 2, in a case that LDPC codes are designed as described above, it will be understood that a performance of a dedicated LDPC code, i.e., a performance of an LDPC code which is designed thereby suitable for an original code rate 8/16 among performances of LDPC codes with a code rate 8/16 is the best, and a performance of an LDPC code which is designed based on a greedy scheme among the performances of the LDPC codes with the code rate 8/16 is the worst. Here, it will be understood that a performance of an LDPC code which is directly designed in a state that the parity check matrix $H_0$ is fixed is degraded due to restriction of a degree of design freedom, but has a performance which almost reaches a performance of a dedicated LDPC code.

As described in FIG. 2, in a case that an RC-LDPC code is designed based on a greedy scheme, if a code rate of the RC-LDPC code is less than the first threshold code rate, a performance of the RC-LDPC code is bad. Here, the first threshold code rate may be varied according to a system situation.

The reason why a performance of an RC-LDPC code with a low code rate is bad will be described below.

(1) The lower a code rate of an RC-LDPC code is, the more restricted a degree of design freedom for the RC-LDPC code is. In a case that an RC-LDPC code with a low code rate is designed based on an extension scheme, a fixed parity check matrix may be set as a design free region, and the RC-LDPC code with the low code rate may be designed based on the design free region.

If an RC-LDPC code is designed based on a greedy scheme, a degree of design freedom for an LDPC code with each code rate which a communication system needs to support may be given to only a part which is newly extended for a code rate. Due to restriction of a degree of design freedom, the more decreased a code rate is, the more degraded a performance of an RC-LDPC code is.

(2) Degree distribution of a check node is irregularly determined. In a case that an RC-LDPC code is designed based on a greedy scheme, the more decreased a code rate is, the lower a degree of an added check node is.

A parity check matrix of an RC-LDPC code with a low code rate has irregular check node-degree distribution. Generally, check node-degree distribution of an optimized LDPC code is regular or almost same as regular degree distribution, so the irregular check node-degree distribution may be a factor that makes a performance of the RC-LDPC code degraded.

As described above, a performance of an RC-LDPC code with a low code rate is bad, so it may be considered that an RC-LDPC code is designed by directly extending a parity check matrix of an LDPC code with the highest code rate.

However, in the case that the RC-LDPC code is designed by directly extending the parity check matrix of the LDPC code with the highest code rate, a performance of an RC-LDPC code with a middle code rate which is greater than or equal to the first threshold code rate and less than a preset second threshold code rate may not be guaranteed. That is, in the case that the RC-LDPC code is designed by directly extending the parity check matrix of the LDPC code with the highest code rate, the performance of the RC-LDPC code with the middle code rate is not considered, so a stable rate compatible-performance is not supported unlike an RC-LDPC code is designed by a greedy scheme.

Performances of LDPC codes which are designed based on different schemes in a communication system according to an embodiment of the present disclosure have been described with reference to FIG. 2, and a performance of an RC-LDPC code with a middle code rate which is designed based on a greedy scheme and a performance of an RC-LDPC code with a middle code rate to which a puncturing scheme is applied in a communication system according to an embodiment of the present disclosure will be described with reference to FIG. 3.

Figure 3:
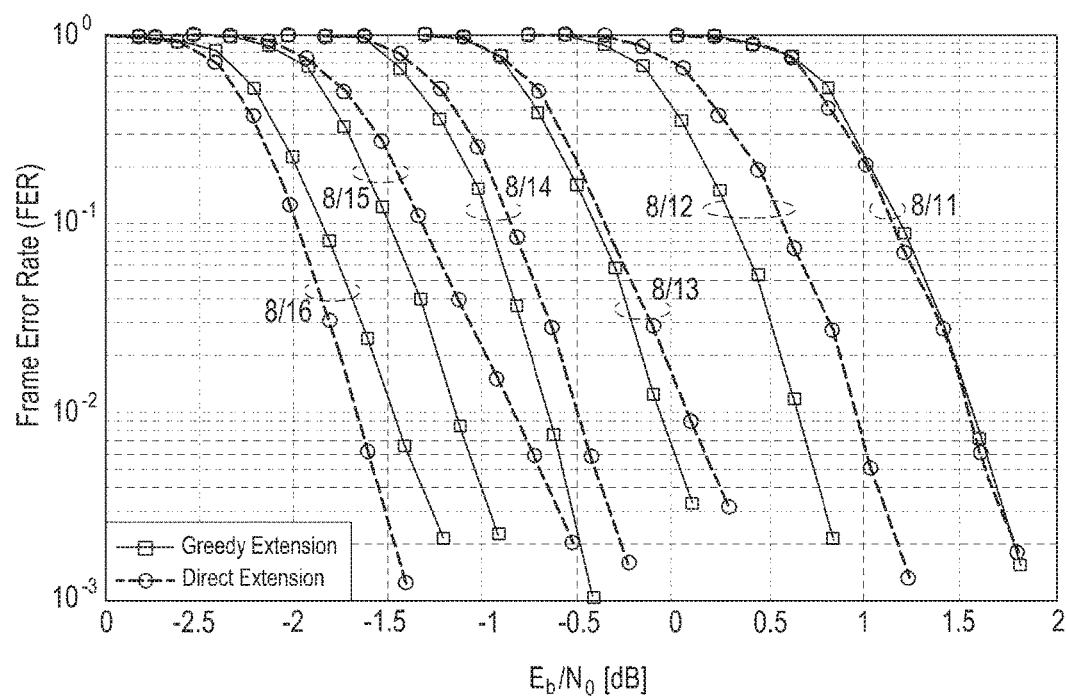
FIG. 3 schematically illustrates a performance of an RC-LDPC code with a middle code rate which is designed based on a greedy scheme and a performance of an RC-LDPC code with a middle code rate to which a puncturing scheme is applied in a communication system according to an embodiment of the present disclosure.

FIG. 3 schematically illustrates a performance of an RC-LDPC code with a middle code rate which is designed based on a greedy scheme and a performance of an RC-LDPC code with a middle code rate to which a puncturing scheme is applied in a communication system according to an embodiment of the present disclosure.

Referring to FIG. 3, it will be noted that a performance of an RC-LDPC code with a middle code rate to which a puncturing scheme is applied is a performance of an RC-LDPC code which is designed by applying a puncturing scheme to an LDPC code which is directly designed and the generated RC-LDPC code has a middle code rate.

In FIG. 3, it will be noted that an RC-LDPC code with a middle code rate which is designed based on a greedy scheme and an RC-LDPC code with a middle code rate to which a puncturing scheme is applied are designed based on a design scheme identical to a design scheme for an RC-LDPC code described in FIG. 2. A detailed description of the design scheme for the RC-LDPC code will be omitted herein.

In FIG. 3, a vertical axis indicates an FER, and a horizontal axis indicates $E_b/N_o$. In FIG. 3, a graph marked as "Greedy Extension" indicates a performance of an RC-LDPC code which is designed based on a greedy scheme, and a graph marked as "Direct Extension" indicates a performance of an RC-LDPC code which is generated by applying a puncturing scheme to an LDPC code which is directly designed.

As shown in FIG. 3, it will be understood that a performance of an RC-LDPC code with a middle code rate to which a puncturing scheme is applied is significantly bad compared to a performance of an RC-LDPC code with a middle code rate which is designed based on a greedy scheme.

As described above, in a case that a target code rate which an RC-LDPC code designer targets is less than the first threshold code rate, it makes difficult for the RC-LDPC code designer to design an RC-LDPC code which has an optimal performance for all code rates if the RC-LDPC code designer designs the RC-LDPC code with the target code rate by applying a greedy scheme to a parity check matrix of an LDPC code with the highest code rate which a communication system needs to support or directly designs the RC-LDPC code with the target code rate.

Performance degradation of an RC-LDPC code with a specific code rate, i.e., a channel code with a specific code rate may affect adversely a communication system to which a link adaptation scheme is applied. The link adaptation scheme denotes a scheme of applying a code rate of a channel code and a modulation scheme according to channel quality. Here, channel quality may be expressed using various metrics such as a signal to interference and noise ratio (SINR), received signal code power (RSCP), reference signal received power (RSRP), a reference signal strength indicator (RSSI), reference signal received quality (RSRQ), a carrier-to-interference noise ratio (CINR), a signal-to-noise ratio (SNR), a block error rate (BLER), and/or the like, and a detailed description thereof will be omitted herein.

In a case that the link adaption scheme is used, if channel quality is good, a channel code with a high code rate is used for supporting a higher data rate, and if channel quality is bad, a channel code with a low code rate which is robust to an error is used.

As described above, if an RC-LDPC code is designed based on a general greedy scheme, a performance of an RC-LDPC code with a low code rate is degraded. If an RC-LDPC code is designed based on a direct scheme, a performance of an RC-LDPC code with a middle code rate is degraded.

As a result, in a case that a link adaptation scheme is applied, an RC-LDPC code designed based on a general greedy scheme may not provide a good performance for all code rates and make it difficult to normally apply an IR-HARQ scheme. That is, a performance of the IR-HARQ scheme is mainly affected by a performance of a channel code with a code rate applied to initial transmission according to channel quality. Performance degradation of a channel code with a specific code rate may degrade a performance and stability of a communication system which applies the IR-HARQ scheme.

An embodiment of the present disclosure proposes a new scheme of designing an RC-LDPC code and a structure of the RC-LDPC code, and a scheme of transmitting and receiving a signal based on the RC-LDPC code designed based on the new scheme.

An RC-LDPC code proposed in an embodiment of the present disclosure is designed thereby optimizing an error correction performance whenever initial transmission to which any code rate is applied is performed in a case that a link adaptation scheme and an IR-HARQ scheme are applied.

A parity check matrix corresponding to an RC-LDPC code according to an embodiment of the present disclosure includes a sub-matrix which corresponds to a form in which an LDPC code which is extended by applying a greedy scheme to an LDPC code with the highest code rate supported in a communication system is concatenated to an LDPC code which is extended by applying a direct scheme to the LDPC code with the highest code rate.

A scheme of transmitting and receiving a signal based on an RC-LDPC code according to an embodiment of the present disclosure includes an encoding scheme and a transmitting scheme for optimizing a performance of a link adaptation scheme and an IR HARQ scheme in a case that the link adaptation scheme and the IR HARQ scheme are applied based on an RC-LDPC code designed according to an embodiment of the present disclosure.

A scheme of transmitting and receiving a signal based on an RC-LDPC code according to an embodiment of the present disclosure includes an encoding scheme, a puncturing scheme and a shortening scheme according to a code rate applied to initial transmission in a case that a link adaptation scheme is applied.

A scheme of transmitting and receiving a signal based on an RC-LDPC code according to an embodiment of the present disclosure includes an encoding scheme, a puncturing scheme, a shortening scheme, and a scheme of determining an order of transmitting a parity bit according to a code rate applied to initial transmission in a case that an IR-HARQ scheme is applied.

Firstly, a scheme of designing an RC-LDPC code and a structure of the RC-LDPC code according to an embodiment of the present disclosure will be described below.

An RC-LDPC code according to an embodiment of the present disclosure includes a parity check matrix as a sub-matrix which has a form in which at least two LDPC codes designed using different schemes are concatenated.

An RC-LDPC designer determines a code rate for which performance optimization is required among various code rates which a communication system needs to support. For convenience, a code rate for which performance optimization is required among various code rates which a communication system needs to support will be referred to as "main code rate". For example, it will be assumed that code rates which the communication needs to supports are code rates $r_0, r_1, \ldots, r_{min}$ ($r_0 > r_1 > \ldots > r_{min}$), and the RC-LDPC code designer determines a code rate $r_k$ among the code rates $r_0, r_1, \ldots, r_{min}$ as a main code rate ($r_0 > r_k > r_{min}$).

The RC-LDPC code designer designs an RC-LDPC code based on a greedy scheme by considering performances of RC-LDPC codes with code rates $r_1, r_2, \ldots, r_k$ according to a preset extension rule from a parity check matrix $H_0$ of an LDPC code with a code rate $r_0$.

It will be assumed that a parity check matrix of an RC-LDPC code designed according to an embodiment of the present disclosure is $H_{Gk}$, and the parity check matrix $H_{Gk}$ may be expressed as Equation 4.

$$H_{Gk} = \begin{bmatrix} H_0 & 0 \\ B_G & T_G \end{bmatrix} \qquad \text{Equation 4}$$

In Equation 4, $T_G$ denotes a final sub-matrix with a lower-triangular form which is designed based on a greedy scheme by considering performances of RC-LDPC codes with code rates $r_1, r_2, \ldots, r_k$.

The RC-LDPC code designer designs a parity check matrix $H_{Dk}$ of an RC-LDPC code which is extended based on a direct scheme by considering a performance of an RC-LDPC code with a code rate $r_k$ from a sub-matrix $H_0$. The parity check matrix $H_{Dk}$ may be expressed as Equation 5.

$$H_{Dk} = \begin{bmatrix} H_0 & 0 \\ B_D & T_D \end{bmatrix} \qquad \text{Equation 5}$$

As described above, the RC-LDPC code designer designs a parity check matrix $H_k$ in Equation 6 for a parity check matrix $H_{Gk}$ and a parity check matrix $H_{Dk}$ which are designed based on different schemes, i.e., a greedy scheme and a direct scheme.

$$H_k = \begin{bmatrix} H_1 & 0 & 0 \\ B_G & T_G & 0 \\ B_D & C & T_D \end{bmatrix} \qquad \text{Equation 6}$$

In Equation 6, a matrix C is a matrix connecting the parity check matrix $H_{Gk}$ and the parity check matrix $H_{Dk}$ and may be designed as a non-zero matrix for performance optimization or a zero matrix for convenience on implementation. A scheme in which a link adaptation scheme and an IR-HARQ scheme are applied may be varied according to a form of the matrix C, this will be described below, and a detailed description thereof will be omitted herein.

Finally, an RC-LDPC code according to an embodiment of the present disclosure may be defined as a parity check matrix in Equation 7 including a parity check matrix $H_C$ as a sub-matrix.

$$H = \begin{bmatrix} H_C & 0 \\ B & T \end{bmatrix} \qquad \text{Equation 7}$$

A scheme of designing an RC-LDPC code and a structure of the RC-LDPC code according to an embodiment of the present disclosure in a case that an RC-LDPC code designer determines only one main code rate has been described above. However, even though the RC-LDPC code designer determines two or more main code rates, the RC-LDPC code designer may design an RC-LDPC code based on a scheme similar to a scheme in the case that the RC-LDPC code designer determines only one main code rate.

An example of a parity check matrix $H_k$ of an RC-LDPC code in a communication system according to an embodiment of the present disclosure will be described with reference to FIG. 4.

Figure 4:
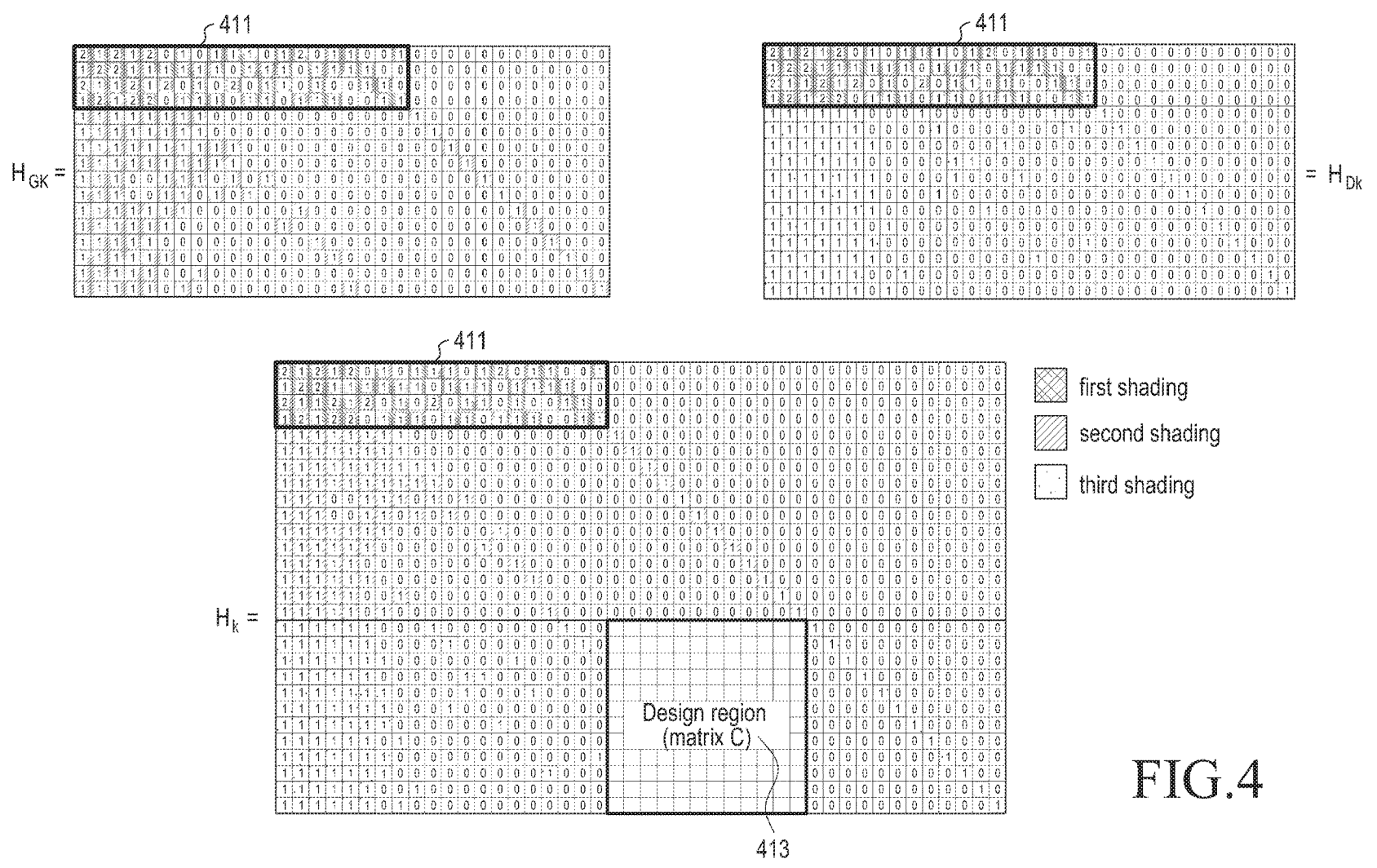

FIG. 4 schematically illustrates an example of a parity check matrix $H_k$ of an RC-LDPC code in a communication system according to an embodiment of the present disclosure.

Referring to FIG. 4, it will be assumed that an example of a parity check matrix $H_k$ is a parity check matrix $H_k$ in a case that a code rate $r_0$ as the highest code rate which the communication system needs to support is 8/10 ($r_0$=8/10), and an RC-LDPC code designer considers one main code rate. Here, it will be assumed that a code rate $r_k$ as the main code rate is 8/16 ($r_k$=8/16).

In FIG. 4, a sub-matrix 411 including unit block matrixes colored with a first shading indicates a parity check matrix $H_0$ supporting the highest code rate 8/10.

In FIG. 4, a sub-matrix including the parity check matrix $H_0$ 411 and unit block matrixes colored with a second shading indicates a parity check matrix $H_{Gk}$ of each of RC-LDPC codes with code rates 8/11, 8/12, 8/13, 8/14, 8/15, and 8/16 which are designed by applying a greedy scheme to the parity check matrix $H_0$ 411.

In FIG. 4, a sub-matrix including unit block matrixes colored with a third shading indicates a parity check matrix $H_{Dk}$ of an RC-LDPC code with a code rate 8/16 which is designed by applying a direct scheme to the parity check matrix $H_0$ 411 by considering only the code rate 8/16.

A parity check matrix $H_k$ supporting the main code rate $r_k$ has a form in which the parity check matrix $H_{Gk}$, the parity check matrix $H_{Dk}$, and an additional sub-matrix are concatenated, as shown in FIG. 4. Here, a sub-matrix C 413 which corresponds to a region which is additionally designed between the parity check matrix $H_{Gk}$ and the parity check matrix $H_{Dk}$ may be implemented with a zero matrix for convenience on implementation or a non-zero matrix for performance optimization. A newly generated part except for the sub-matrix C 413 may include a zero matrix for convenience on encoding.

A scheme of designing an RC-LDPC code and a structure of the RC-LDPC code according to an embodiment of the present disclosure have been described above, and a scheme of transmitting and receiving a signal based on an RC-LDPC code according to an embodiment of the present disclosure will be described below.

Firstly, a link adaptation scheme which is based on an RC-LDPC code according to an embodiment of the present disclosure will be described below.

A link adaptation scheme which is based on an RC-LDPC code according to an embodiment of the present disclosure is performed based on a structure of an RC-LDPC code which is designed by considering only a main code rate $r_k$ as described in FIG. 4. In FIG. 4, an RC-LDPC code designer designs an RC-LDPC code by considering one main code rate, however, the RC-LDPC code designer may design an RC-LDPC code by considering at least two main code rates.

A link adaptation scheme which is based on an RC-LDPC code according to an embodiment of the present disclosure may be effectively applied to a case that an RC-LDPC code designer considers at least two main code rates.

It will be assumed that a transmission code rate which is determined according to channel quality in a communication system supporting an adaptive modulation and coding (AMC) scheme is a code rate r.

Firstly, a case that the transmission code rate r is less than or equal to a code rate $r_0$ as the highest code rate which the communication system needs to support and the transmission code rate r is greater than a code rate $r_k$ as a main code rate ($r_0 \geq r > r_k$) will be considered. In this case, an encoding operation is performed in order that a parity check matrix of a region which corresponds to a parity check matrix $H_{Gk}$ of which a performance at the transmission code rate r is optimized may be used. That is, parity bits which correspond to a region which corresponds to a parity check matrix $H_{Dk}$ in a parity check matrix $H_k$ are punctured based on a preset puncturing scheme in order that the region is unused.

All parity bits corresponding to the parity check matrix $H_{Dk}$ are punctured, and parity bits of which the number is for satisfying a transmission code rate r are additionally punctured from parity bits which correspond to the parity check matrix $H_{Gk}$ based on a preset order. The order may be determined based on the last parity bit among the parity bits which correspond to the parity check matrix $H_{Gk}$, the first parity bit among the parity bits which correspond to the parity check matrix $H_{Gk}$, or one of the parity bits which correspond to the parity check matrix $H_{Gk}$.

For convenience, in an embodiment of the present disclosure, it will be assumed that the order is determined based on the last parity bit among the parity bits which correspond to the parity check matrix $H_{Gk}$. That is, in an embodiment of the present disclosure, it will be assumed that parity bits of which the number is for satisfying a transmission code rate r are punctured from the last parity bit among parity bits which correspond to a parity check matrix $H_{Gk}$. Here, a puncturing scheme is the same as a puncturing scheme applied to a general LDPC code, so a detailed description thereof will be omitted herein.

An example of an encoding process according to a transmission code rate in a communication system supporting an RC-LDPC code according to an embodiment of the present disclosure will be described with reference to FIG. 5.

Figure 5:
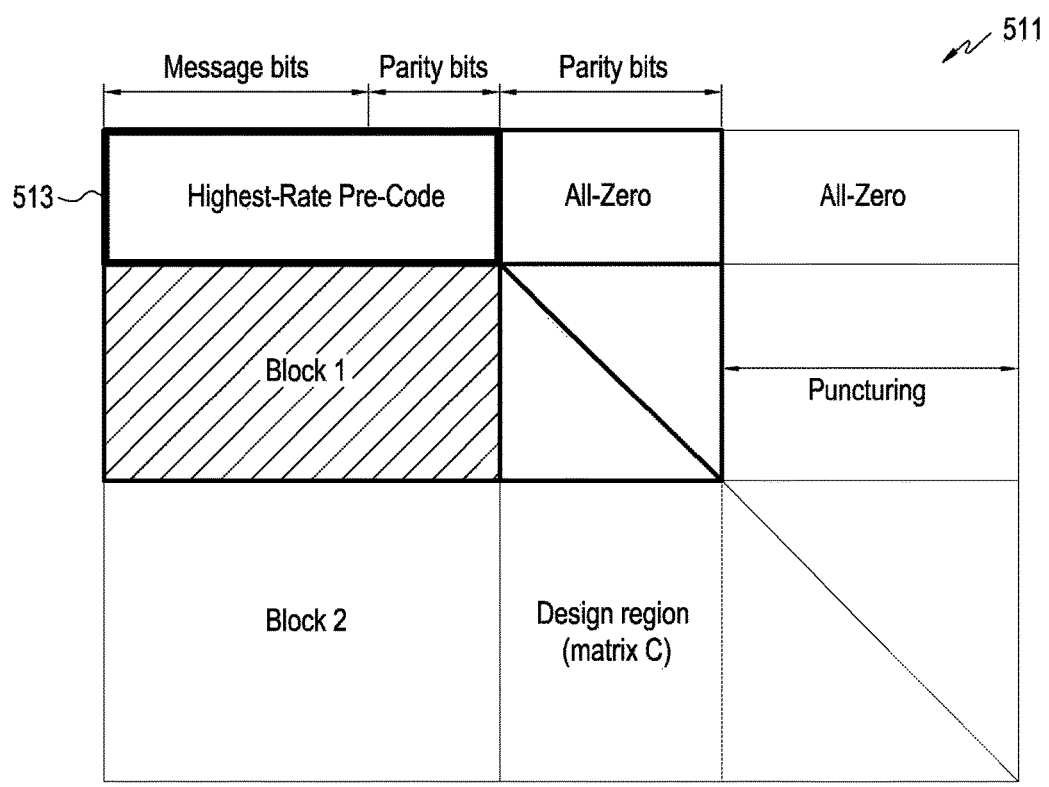
FIG. 5 schematically illustrates an example of an encoding process according to a transmission code rate in a communication system supporting an RC-LDPC code according to an embodiment of the present disclosure.

FIG. 5 schematically illustrates an example of an encoding process according to a transmission code rate in a communication system supporting an RC-LDPC code according to an embodiment of the present disclosure.

Referring to FIG. 5, it will be noted that an encoding process according to a transmission code rate in FIG. 5 is an encoding process according to a transmission code rate in a case that a code rate r as the transmission code rate is less than or equal to a code rate $r_0$ as the highest code rate which the communication system needs to support and greater than a code rate $r_k$ as a main code rate $r_k$ ($r_0 \geq r > r_k$).

Further, it will be assumed that a signal transmitting apparatus performs a signal transmitting operation based on a parity check matrix $H_k$ 511 which corresponds to an RC-LDPC code with the code rate $r_k$.

The transmission code rate r is a high code rate which is greater than a preset threshold code rate, e.g., a code rate $r_k$. In a case that a signal transmitting apparatus needs to transmit a signal with a high code rate, the signal transmitting apparatus punctures parity bits from the last parity bit among parity bits included in a codeword which is generated corresponding to the parity check matrix $H_k$ 511 until the code rate r is satisfied for generating a codeword which corresponds to the code rate r, as shown in FIG. 5. That is, as shown in FIG. 5, it will be understood that the codeword generated corresponding to a parity check matrix $H_0$ 513 which corresponds to the code rate $r_0$ is included in the codeword, and a part of parity bits included in the codeword generated corresponding to the parity check matrix $H_k$ 511 is included in the codeword.

In FIG. 5, the signal transmitting apparatus punctures parity bits from the last parity bit among parity bits included in an RC-LDPC codeword which is generated corresponding to the parity check matrix $H_k$ 511 until the code rate r is satisfied. However, the signal transmitting apparatus may puncture any parity bits among the parity bits included in the RC-LDPC codeword which is generated corresponding to the parity check matrix $H_k$ 511 thereby the code rate r is satisfied.

An example of an encoding process according to a transmission code rate in a communication system supporting an RC-LDPC code according to an embodiment of the present disclosure has been described with reference to FIG. 5, and another example of an encoding process according to a transmission code rate in a communication system supporting an RC-LDPC code according to an embodiment of the present disclosure will be described with reference to FIG. 6.

Figure 6:
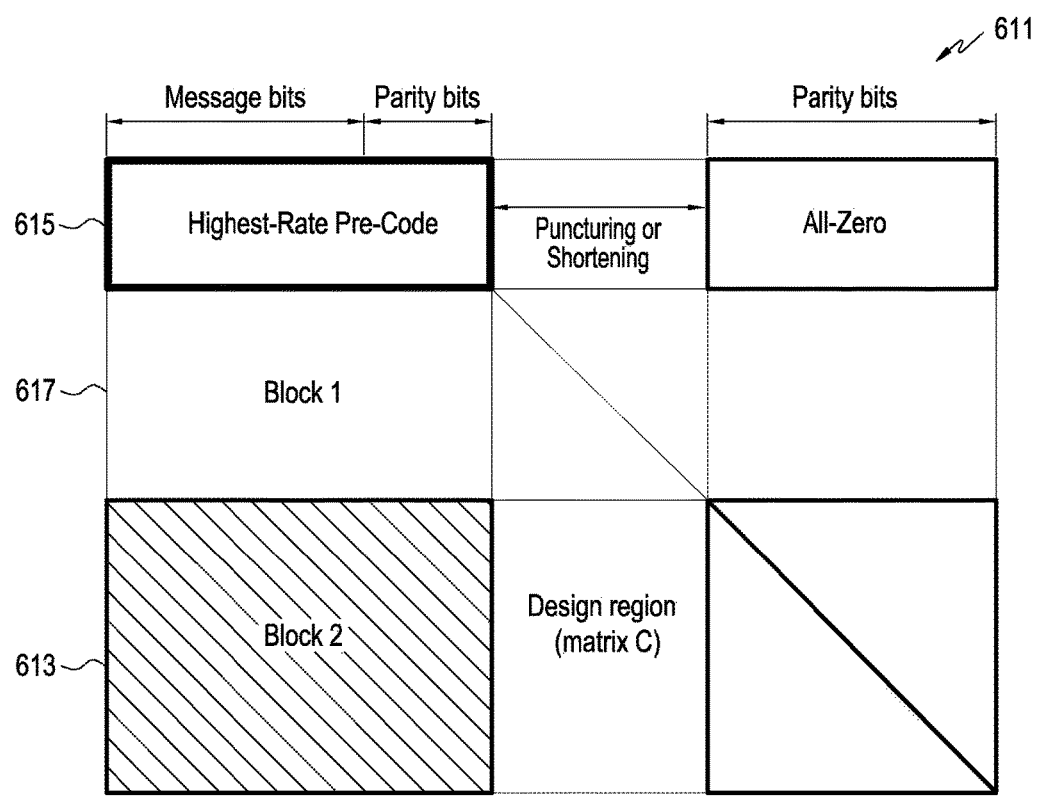
FIG. 6 schematically illustrates another example of an encoding process according to a transmission code rate in a communication system supporting an RC-LDPC code according to an embodiment of the present disclosure.

FIG. 6 schematically illustrates another example of an encoding process according to a transmission code rate in a communication system supporting an RC-LDPC code according to an embodiment of the present disclosure.

Referring to FIG. 6, it will be noted that an encoding process according to a transmission code rate in FIG. 6 is a process of puncturing or shortening an RC-LDPC code according to a transmission code rate in a case that a code rate r as the transmission code rate is less than or equal to a code rate $r_k$ as a main code rate determined in the communication system ($r \leq r_k$). Further, it will be assumed that a signal transmitting apparatus performs a signal transmitting operation based on a parity check matrix $H_k$ 611 which corresponds to an RC-LDPC code with the code rate $r_k$.

The transmission code rate r is a low code rate which is less than or equal to a preset threshold code rate, e.g., a code rate $r_k$. In a case that a signal transmitting apparatus needs to transmit a signal with a low code rate, for generating a codeword which corresponds to the code rate r, as shown in FIG. 6, the signal transmitting apparatus punctures or shortens parity bits until the code rate r is satisfied thereby parity bits which corresponds to a parity check matrix $H_{Dk}$ 613 among parity bits included in a codeword generated corresponding to the parity check matrix $H_k$ 611 are transmitted.

That is, as shown in FIG. 6, it will be understood that the codeword generated corresponding to a parity check matrix $H_0$ 615 which corresponds to the code rate $r_0$ is included in the codeword, and a part of parity bits included in the codeword generated corresponding to the parity check matrix $H_k$ 611, i.e., parity bits corresponding to a parity check matrix $H_{Dk}$ 613 are included in the codeword. That is, parity bits corresponding to a parity check matrix $H_{Gk}$ 617 are punctured or shortened thereby the parity bits are not included in the codeword.

In FIG. 6, the reason why only the parity bits corresponding to the parity check matrix $H_{Dk}$ 613 are included in the codeword is that the parity check matrix $H_{Dk}$ 613 is designed in order that a performance of the parity check matrix $H_{Dk}$ 613 is optimized to the code rate r.

In FIG. 6, the parity bits corresponding to the parity check matrix $H_{Gk}$ 617 are punctured or shortened in order that the parity bits corresponding to the parity check matrix $H_{Gk}$ 617 are not included in the codeword. Whether the parity bits corresponding to the parity check matrix $H_{Gk}$ 617 are punctured or shortened may be varied according to whether a matrix C as a matrix connecting the parity check matrix $H_{Gk}$ 617 and the parity check matrix $H_{Dk}$ 613 is a zero matrix, and this will be described below.

Firstly, a case that the matrix C is the zero matrix will be described below.

If the matrix C is the zero matrix, the parity bits corresponding to the parity check matrix $H_{Gk}$ 617 are punctured and not included in the codeword. That is, compared to a case that parity bits to be punctured are punctured from the last parity bit corresponding to a code rate in a general RC-LDPC code, parity bits to be punctured are punctured from a specific parity bit, not the last parity bit corresponding to a code rate in an RC-LDPC code according to an embodiment of the present disclosure.

An embodiment of the present disclosure may implement a link adaptation scheme for supporting a better error correction performance for a code rate by changing a puncturing order of parity bits to be punctured.

Secondly, a case that the matrix C is not the zero matrix will be described below.

If the matrix C is not the zero matrix, the parity bits corresponding to the parity check matrix $H_{Gk}$ 617 are shortened and not included in the codeword. Here, shortening means that a bit value of a bit is fixed to 0. The reason why the signal transmitting apparatus performs a shortening operation, not a puncturing operation on the parity bits corresponding to the parity check matrix $H_{Gk}$ 617 is that the parity bits generated corresponding to the parity check matrix $H_{Gk}$ 617 are related to the parity bits generated corresponding to the parity check matrix $H_{Dk}$ since the matrix C is not the zero matrix.

In an embodiment of the present disclosure, the parity bits generated corresponding to the parity check matrix $H_{Gk}$ 617 are not punctured, but the parity bits generated corresponding to the parity check matrix $H_{Gk}$ 617 are shortened for fixing the parity bits generated corresponding to the parity check matrix $H_{Gk}$ 617 to specific values.

This shortened parity bits are not transmitted, so a decoder included in a signal receiving apparatus may perform a decoding operation based on a parity check matrix $H_{Dk}$ 613 which corresponds to an RC-LDPC code designed based on a direct scheme.

A link adaptation scheme which is based on an RC-LDPC code according to an embodiment of the present disclosure has been described above, and an IR-HARQ scheme which is based on an RC-LDPC code according to an embodiment of the present disclosure will be described below.

In a communication system supporting an IR-HARQ scheme, a code rate applied to initial transmission is determined according to channel quality, an operation of generating a codeword which corresponds to the determined code rate has been described in a link adaptation scheme which is based on an RC-LDPC code according to an embodiment of the present disclosure, so a detailed description thereof will be omitted herein.

If a signal receiving apparatus fails in decoding initial transmission of a signal transmitting apparatus, the signal transmitting apparatus transmits additional parity bits to the signal receiving apparatus. In an embodiment of the present disclosure, location of the additional parity bits may be varied according to a code rate applied to the initial transmission, and this will be described below.

An example of a process of applying an IR-HARQ scheme in a communication system supporting an RC-LDPC code according to an embodiment of the present disclosure will be described with reference to FIG. 7.

Figure 7:
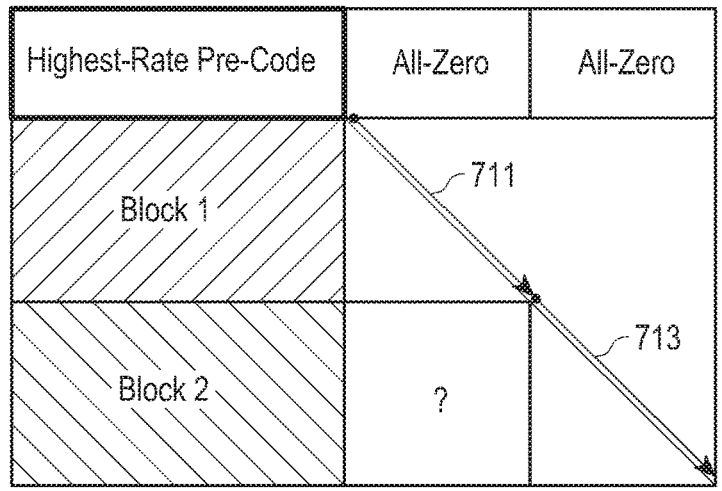
FIG. 7 schematically illustrates an example of a process of applying an incremental redundancy-hybrid automatic retransmission request (IR-HARQ) scheme in a communication system supporting an RC-LDPC code according to an embodiment of the present disclosure.

FIG. 7 schematically illustrates an example of a process of applying an IR-HARQ scheme in a communication system supporting an RC-LDPC code according to an embodiment of the present disclosure.

Referring to FIG. 7, it will be noted that a process of applying an IR-HARQ scheme in FIG. 7 is a process of applying an IR-HARQ scheme in a case that a code rate r as a code rate which is applied to initial transmission is less than or equal to a code rate $r_0$ as the highest code rate which the communication system needs to support and the code rate r is greater than a code rate $r_k$ as a main code rate ($r_0 \geq r > r_k$).

In FIG. 7, upon detecting that a signal receiving apparatus has failed in decoding of initial transmission of a signal transmitting apparatus, the signal transmitting apparatus determines parity bits 711 which correspond to a parity check matrix $H_{Gk}$ as additional parity bits until a code rate $r_k$, and transmits the determined additional parity bits to the signal receiving apparatus. If a code rate is less than the code rate $r_k$ while the signal transmitting apparatus transmits the additional parity bits, the signal transmitting apparatus determines parity bits 713 which correspond to a parity check matrix $H_{Dk}$ as additional parity bits, and transmits the determined additional parity bits to the signal receiving apparatus.

For convenience, in a process of applying an IR-HARQ scheme in FIG. 7, a signal transmitting apparatus determines parity bits 711 which correspond to a parity check matrix $H_{Gk}$ as additional parity bits until a code rate $r_k$ and determines parity bits 713 which correspond to a parity check matrix $H_{Dk}$ as additional parity bits if a code rate is less than the code rate $r_k$.

Further, it will be noted that a process of applying an IR-HARQ scheme which is based on an RC-LDPC code according to an embodiment of the present disclosure in FIG. 7 is a process of applying an IR-HARQ scheme which is based on an RC-LDPC code according to an embodiment of the present disclosure in a case that a code rate applied to initial transmission is relatively high.

An example of a process of applying an IR-HARQ scheme in a communication system supporting an RC-LDPC code according to an embodiment of the present disclosure has been described with reference to FIG. 7, and another example of a process of applying an IR-HARQ scheme in a communication system supporting an RC-LDPC code according to an embodiment of the present disclosure will be described with reference to FIG. 8.

Figure 8:
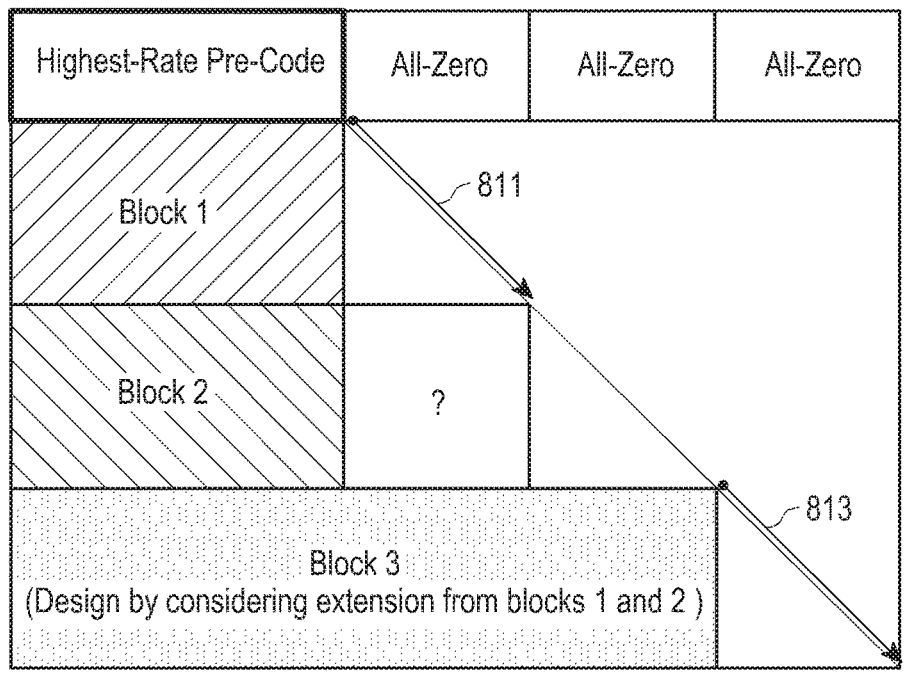
FIG. 8 schematically illustrates another example of a process of applying an IR-HARQ scheme in a communication system supporting an RC-LDPC code according to an embodiment of the present disclosure.

FIG. 8 schematically illustrates another example of a process of applying an IR-HARQ scheme in a communication system supporting an RC-LDPC code according to an embodiment of the present disclosure.

Referring to FIG. 8, it will be noted that a process of applying an IR-HARQ scheme in FIG. 8 is a process of applying an IR-HARQ scheme in a case that a code rate r as a code rate which is applied to initial transmission is less than or equal to a code rate $r_0$ as the highest code rate which the communication system needs to support and the code rate r is greater than a code rate $r_k$ as a main code rate ($r_0 \geq r > r_k$).

In FIG. 8, upon detecting that a signal receiving apparatus has failed in decoding of initial transmission of a signal transmitting apparatus, the signal transmitting apparatus determines parity bits 811 which correspond to a parity check matrix $H_{Gk}$ as additional parity bits until a code rate $r_k$, and transmits the determined additional parity bits to the signal receiving apparatus. If a code rate is less than the code rate $r_k$ while the signal transmitting apparatus transmits the additional parity bits, the signal transmitting apparatus determines parity bits 813 which correspond to a parity check matrix concatenated after a parity check matrix $H_{Dk}$ as additional parity bits, and transmits the determined additional parity bits to the signal receiving apparatus. Here, the parity check matrix concatenated after the parity check matrix $H_{Dk}$ may be designed thereby the parity check matrix concatenated after the parity check matrix $H_{Dk}$ has a good performance if the parity check matrix concatenated after the parity check matrix $H_{Dk}$ is concatenated to each of the parity check matrix $H_{Dk}$ and the parity check matrix $H_{Gk}$. Optimization of the parity check matrix concatenated after the parity check matrix $H_{Dk}$ may be performed based on a kind of cost function.

In a process of applying an IR-HARQ scheme in FIG. 8, a signal transmitting apparatus determines parity bits 811 which correspond to a parity check matrix $H_{Gk}$ as additional parity bits until a code rate $r_k$ and determines parity bits 813 which correspond to a parity check matrix concatenated after a parity check matrix $H_{Dk}$ as additional parity bits if a code rate is less than the code rate $r_k$.

Further, it will be noted that a process of applying an IR-HARQ scheme which is based on an RC-LDPC code according to an embodiment of the present disclosure in FIG. 8 is a process of applying an IR-HARQ scheme which is based on an RC-LDPC code according to an embodiment of the present disclosure in a case that a code rate applied to initial transmission is relatively high.

Another example of a process of applying an IR-HARQ scheme in a communication system supporting an RC-LDPC code according to an embodiment of the present disclosure has been described with reference to FIG. 8, and still another example of a process of applying an IR-HARQ scheme in a communication system supporting an RC-LDPC code according to an embodiment of the present disclosure will be described with reference to FIG. 9.

Figure 9:
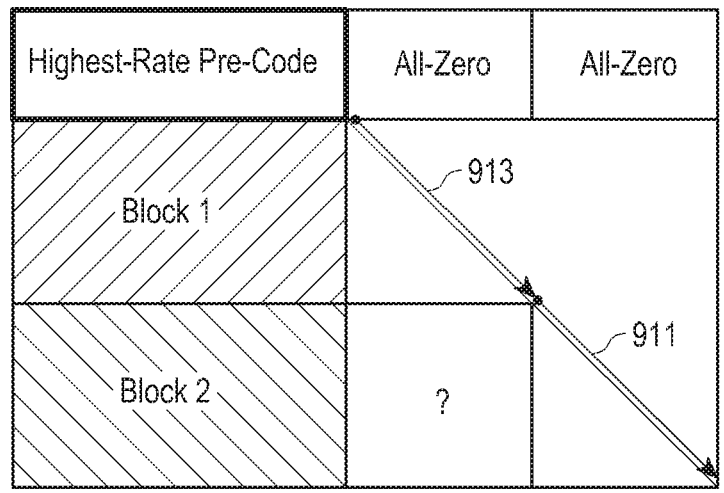
FIG. 9 schematically illustrates still another example of a process of applying an IR-HARQ scheme in a communication system supporting an RC-LDPC code according to an embodiment of the present disclosure.

FIG. 9 schematically illustrates still another example of a process of applying an IR-HARQ scheme in a communication system supporting an RC-LDPC code according to an embodiment of the present disclosure.

Referring to FIG. 9, it will be noted that a process of applying an IR-HARQ scheme in FIG. 9 is a process of applying an IR-HARQ scheme in a case that a code rate r as a code rate which is applied to initial transmission is less than or equal to a code rate $r_k$ as a main code rate ($r \leq r_k$).

In FIG. 9, upon detecting that a signal receiving apparatus has failed in decoding of initial transmission of a signal transmitting apparatus, the signal transmitting apparatus determines parity bits 911 which correspond to a parity check matrix $H_{Dk}$ as additional parity bits until a code rate $r_k$, and transmits the determined additional parity bits to the signal receiving apparatus. If a code rate is less than the code rate $r_k$ while the signal transmitting apparatus transmits the additional parity bits, the signal transmitting apparatus determines parity bits 913 which correspond to a parity check matrix $H_{Gk}$ as additional parity bits, and transmits the determined additional parity bits to the signal receiving apparatus.

For convenience, in a process of applying an IR-HARQ scheme in FIG. 9, a signal transmitting apparatus determines parity bits 911 which correspond to a parity check matrix $H_{Dk}$ as additional parity bits until a code rate $r_k$ and determines parity bits 913 which correspond to a parity check matrix $H_{Gk}$ as additional parity bits if a code rate is less than the code rate $r_k$.

Further, it will be noted that a process of applying an IR-HARQ scheme which is based on an RC-LDPC code according to an embodiment of the present disclosure in FIG. 9 is a process of applying an IR-HARQ scheme which is based on an RC-LDPC code according to an embodiment of the present disclosure in a case that a code rate applied to initial transmission is relatively low.

Still another example of a process of applying an IR-HARQ scheme in a communication system supporting an RC-LDPC code according to an embodiment of the present disclosure has been described with reference to FIG. 9, and still another example of a process of applying an IR-HARQ scheme in a communication system supporting an RC-LDPC code according to an embodiment of the present disclosure will be described with reference to FIG. 10.

Figure 10:
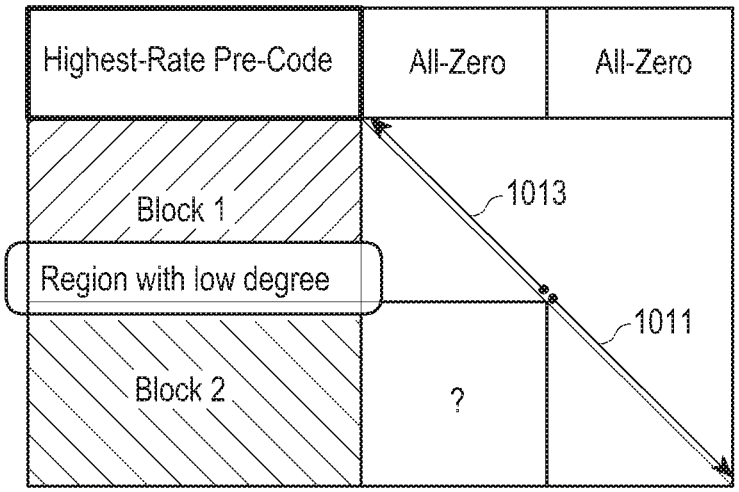
FIG. 10 schematically illustrates still another example of a process of applying an IR-HARQ scheme in a communication system supporting an RC-LDPC code according to an embodiment of the present disclosure.

FIG. 10 schematically illustrates still another example of a process of applying an IR-HARQ scheme in a communication system supporting an RC-LDPC code according to an embodiment of the present disclosure.

Referring to FIG. 10, it will be noted that a process of applying an IR-HARQ scheme in FIG. 10 is a process of applying an IR-HARQ scheme in a case that a code rate r as a code rate which is applied to initial transmission is less than or equal to a code rate $r_k$ as a main code rate ($r \le r_k$).

In FIG. 10, upon detecting that a signal receiving apparatus has failed in decoding of initial transmission of a signal transmitting apparatus, the signal transmitting apparatus determines parity bits 1011 which correspond to a parity check matrix $H_{Dk}$ as additional parity bits until a code rate $r_k$, and transmits the determined additional parity bits to the signal receiving apparatus. If a code rate is less than the code rate $r_k$ while the signal transmitting apparatus transmits the additional parity bits, the signal transmitting apparatus determines additional parity bits as an inverse order of parity bits 1013 which correspond to a parity check matrix $H_{Gk}$, and transmits the determined additional parity bits to the signal receiving apparatus.

The reason why the signal transmitting apparatus determines the additional parity bits as the inverse order of the parity bits 1013 which correspond to the parity check matrix $H_{Gk}$ is for enhancing a system performance of a communication system supporting the IR-HARQ scheme. That is, the parity check matrix $H_{Gk}$ is generated based on a greedy scheme, and a check node with a low degree is at a lower part of the parity check matrix $H_{Gk}$. If a code rate becomes low, addition of a check node with a low degree may enhance a performance of an IR-HARQ scheme, so the signal transmitting apparatus firstly determines parity bits which correspond to a check node with a low degree as additional parity bits for enhancing a performance of the IR-HARQ scheme.

Further, it will be noted that a process of applying an IR-HARQ scheme which is based on an RC-LDPC code according to an embodiment of the present disclosure in FIG. 10 is a process of applying an IR-HARQ scheme which is based on an RC-LDPC code according to an embodiment of the present disclosure in a case that a code rate applied to initial transmission is relatively low.

Still another example of a process of applying an IR-HARQ scheme in a communication system supporting an RC-LDPC code according to an embodiment of the present disclosure has been described with reference to FIG. 10, and still another example of a process of applying an IR-HARQ scheme in a communication system supporting an RC-LDPC code according to an embodiment of the present disclosure will be described with reference to FIG. 11.

Figure 11:
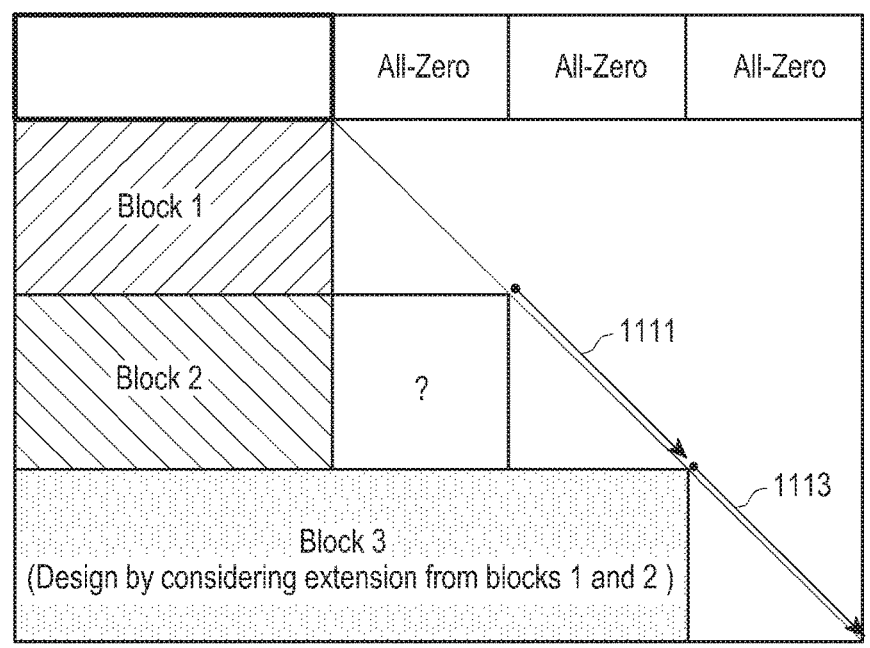
FIG. 11 schematically illustrates still another example of a process of applying an IR-HARQ scheme in a communication system supporting an RC-LDPC code according to an embodiment of the present disclosure.

FIG. 11 schematically illustrates still another example of a process of applying an IR-HARQ scheme in a communication system supporting an RC-LDPC code according to an embodiment of the present disclosure.

Referring to FIG. 11, it will be noted that a process of applying an IR-HARQ scheme in FIG. 11 is a process of applying an IR-HARQ scheme in a case that a code rate r as a code rate which is applied to initial transmission is less than or equal to a code rate $r_k$ as a main code rate ($r \le r_k$).

In FIG. 11, upon detecting that a signal receiving apparatus has failed in decoding of initial transmission of a signal transmitting apparatus, the signal transmitting apparatus determines parity bits 1111 which correspond to a parity check matrix $H_{Dk}$ as additional parity bits until a code rate $r_k$, and transmits the determined additional parity bits to the signal receiving apparatus. If a code rate is less than the code rate $r_k$ while the signal transmitting apparatus transmits the additional parity bits, the signal transmitting apparatus determines parity bits 1113 which correspond to a parity check matrix concatenated after the parity check matrix $H_{Dk}$ as additional parity bits, and transmits the determined additional parity bits to the signal receiving apparatus. Here, the parity check matrix concatenated after the parity check matrix $H_{Dk}$ may be designed so that thereby the parity check matrix concatenated after the parity check matrix $H_{Dk}$ has a good performance if the parity check matrix concatenated after the parity check matrix $H_{Dk}$ is concatenated to each of the parity check matrix $H_{Dk}$ and a parity check matrix $H_{Gk}$. Optimization of the parity check matrix concatenated after the parity check matrix $H_{Dk}$ may be performed based on a kind of cost function.

Further, it will be noted that a process of applying an IR-HARQ scheme which is based on an RC-LDPC code according to an embodiment of the present disclosure in FIG. 11 is a process of applying an IR-HARQ scheme which is based on an RC-LDPC code according to an embodiment of the present disclosure in a case that a code rate applied to initial transmission is relatively low.

Still another example of a process of applying an IR-HARQ scheme in a communication system supporting an RC-LDPC code according to an embodiment of the present disclosure has been described with reference to FIG. 11, and an inner structure of a signal transmitting apparatus in a communication system according to an embodiment of the present disclosure will be described with reference to FIG. 12.

Figure 12:
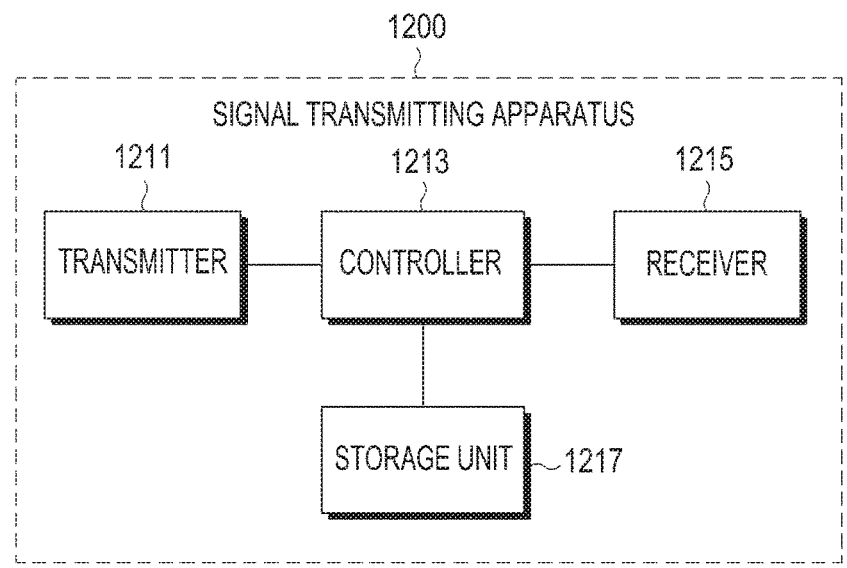
FIG. 12 schematically illustrates an inner structure of a signal transmitting apparatus in a communication system according to an embodiment of the present disclosure.

FIG. 12 schematically illustrates an inner structure of a signal transmitting apparatus in a communication system according to an embodiment of the present disclosure.

Referring to FIG. 12, a signal transmitting apparatus 1200 includes a transmitter 1211, a controller 1213, a receiver 1215, and a storage unit 1217.

The controller 1213 controls the overall operation of the signal transmitting apparatus 1200. More particularly, the controller 1213 controls an operation related to a scheme of transmitting and receiving a signal based on an RC-LDPC code according to an embodiment of the present disclosure, e.g., an operation related to a link adaptation scheme which is based on an RC-LDPC code according to an embodiment of the present disclosure and an IR-HARQ scheme which is based on an RC-LDPC code according to an embodiment of the present disclosure. The operation related to the scheme of transmitting and receiving the signal based on the RC-LDPC code according to an embodiment of the present disclosure, e.g., the operation related to the link adaptation scheme which is based on the RC-LDPC code according to an embodiment of the present disclosure and the IR-HARQ scheme which is based on the RC-LDPC code according to an embodiment of the present disclosure has been described with FIGS. 2 to 11, and a detailed description thereof will be omitted herein.

The transmitter 1211 transmits various signals and various messages to other devices in the communication system, e.g., a signal receiving apparatus and/or the like under a control of the controller 1213. The various signals and various messages transmitted in the transmitter 1211 have been described with reference to FIGS. 2 to 11, and a detailed description thereof will be omitted herein.

The receiver 1215 receives various signals and various messages from other devices in the communication system, e.g., a signal receiving apparatus and/or the like under a control of the controller 1213. The various signals and various messages received in the receiver 1215 have been described with reference to FIGS. 2 to 11, and a detailed description thereof will be omitted herein.

The storage unit 1217 stores various programs, various data, and/or the like related to the operation related to the scheme of transmitting and receiving the signal based on the RC-LDPC code according to an embodiment of the present disclosure, e.g., the operation related to the link adaptation scheme which is based on the RC-LDPC code according to an embodiment of the present disclosure and the IR-HARQ scheme which is based on the RC-LDPC code according to an embodiment of the present disclosure under a control of the controller 1213.

The storage unit 1217 stores various signals and various messages which are received by the receiver 1215 from the other devices.

While the transmitter 1211, the controller 1213, the receiver 1215, and the storage unit 1217 are described in the signal transmitting apparatus 1200 as separate units, it is to be understood that this is merely for convenience of description. In other words, two or more of the transmitter 1211, the controller 1213, the receiver 1215, and the storage unit 1217 may be incorporated into a single unit.

The signal transmitting apparatus 1200 may be implemented with at least one processor.

An inner structure of a signal transmitting apparatus in a communication system according to an embodiment of the present disclosure has been described with reference to FIG. 12, and an inner structure of a signal receiving apparatus in a communication system according to an embodiment of the present disclosure will be described with reference to FIG. 13.

Figure 13:
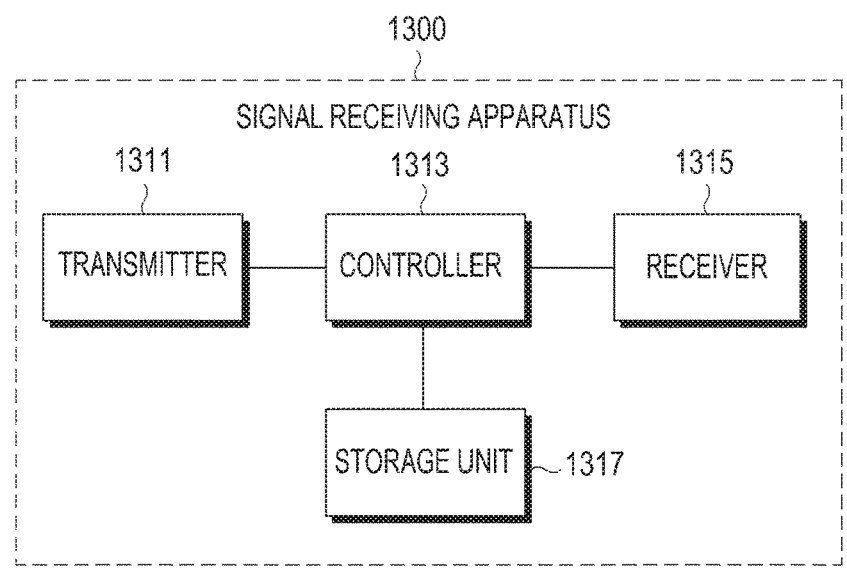
FIG. 13 schematically illustrates an inner structure of a signal receiving apparatus in a communication system according to an embodiment of the present disclosure.

FIG. 13 schematically illustrates an inner structure of a signal receiving apparatus in a communication system according to an embodiment of the present disclosure.

Referring to FIG. 13, a signal receiving apparatus 1300 includes a transmitter 1311, a controller 1313, a receiver 1315, and a storage unit 1317.

The controller 1313 controls the overall operation of the signal receiving apparatus 1300. More particularly, the controller 1313 controls an operation related to a scheme of transmitting and receiving a signal based on an RC-LDPC code according to an embodiment of the present disclosure, e.g., an operation related to a link adaptation scheme which is based on an RC-LDPC code according to an embodiment of the present disclosure and an IR-HARQ scheme which is based on an RC-LDPC code according to an embodiment of the present disclosure. This will be described below.

As described in FIGS. 2 to 11, a signal transmitting apparatus transmits a signal based on the scheme of transmitting the signal based on the RC-LDPC code according to an embodiment of the present disclosure, e.g., the operation related to the link adaptation scheme which is based on the RC-LDPC code according to an embodiment of the present disclosure and the IR-HARQ scheme which is based on the RC-LDPC code according to an embodiment of the present disclosure. Then, a signal receiving apparatus receives the signal transmitted from the signal transmitting apparatus and selects a code rate used in the signal transmitting apparatus and a decoding initial value which corresponds to a puncturing operation or a shortening operation which corresponds to the used code rate.

The transmitter 1311 transmits various signals and various messages to other devices in the communication system, e.g., a signal transmitting apparatus and/or the like under a control of the controller 1313. The various signals and various messages transmitted in the transmitter 1311 have been described with reference to FIGS. 2 to 11, and a detailed description thereof will be omitted herein.

The receiver 1315 receives various signals and various messages from other devices in the communication system, e.g., a signal transmitting apparatus and/or the like under a control of the controller 1313. The various signals and various messages received in the receiver 1315 have been described with reference to FIGS. 2 to 11, and a detailed description thereof will be omitted herein.

The storage unit 1317 stores various programs, various data, and/or the like related to the operation related to the scheme of transmitting and receiving the signal based on the RC-LDPC code according to an embodiment of the present disclosure, e.g., the operation related to the link adaptation scheme which is based on the RC-LDPC code according to an embodiment of the present disclosure and the IR-HARQ scheme which is based on the RC-LDPC code according to an embodiment of the present disclosure under a control of the controller 1313.

The storage unit 1317 stores various signals and various messages which are received by the receiver 1315 from the other devices.

While the transmitter 1311, the controller 1313, the receiver 1315, and the storage unit 1317 are described in the signal receiving apparatus 1300 as separate units, it is to be understood that this is merely for convenience of description. In other words, two or more of the transmitter 1311, the controller 1313, the receiver 1315, and the storage unit 1317 may be incorporated into a single unit.

The signal receiving apparatus 1300 may be implemented with at least one processor.

In accordance with various embodiments of the present disclosure, a method for receiving a signal in a receiving apparatus in a communication system supporting an RC-LDPC code is provided. The method includes receiving a signal from a transmitting apparatus, and performing a decoding operation on the signal corresponding to a first parity check matrix and a first code rate used in the transmitting apparatus. The first parity check matrix includes a second parity check matrix supporting a second code rate, a third parity check matrix supporting a third code rate, a sub-matrix used for concatenating the second parity check matrix and the third parity check matrix, and a fourth parity check matrix shared with the second parity check matrix, the third parity check matrix, and the sub-matrix. The fourth parity check matrix is a parity check matrix supporting a maximum code rate among code rates supported in the communication system.

Preferably, the second code rate includes a predetermined code rate among the code rates supported in the communication system.

Preferably, if the first code rate is greater than the second code rate and the first code rate is less than or equal to the maximum code rate, the performing of the decoding operation on the signal comprises decoding the signal by considering all parity bits generated corresponding to the third parity check matrix and a part of parity bits generated corresponding to the second parity check matrix which are punctured from the codeword generated based on the first parity check matrix and the first code rate.

Preferably, if the first code rate is less than or equal to the second code rate, the performing of the decoding operation on the signal comprises decoding the signal by considering all parity bits generated corresponding to the second parity check matrix which are punctured from the codeword generated based on the first parity check matrix and the first code rate.

Preferably, if the first code rate is less than or equal to the second code rate, the performing of the decoding operation on the signal comprises decoding the signal by considering all parity bits generated corresponding to the second parity check matrix which are shortened from the codeword generated based on the first parity check matrix and the first code rate.

Preferably, the method further comprises detecting that decoding of the transmission signal is failed; additionally receiving a signal from the transmitting apparatus; and performing a decoding operation on the received signal and the additionally received signal.

Preferably, if the first code rate is greater than the second code rate and the first code rate is less than or equal to the maximum code rate, the additionally received signal includes parity bits which correspond to the second parity check matrix until a code rate applied to the additionally received signal reaches the second code rate, and the additionally received signal includes parity bits which correspond to the third parity check matrix if the code rate applied to the additionally received signal is less than the second code rate.

Preferably, if the first code rate is greater than the second code rate and less than or equal to the maximum code rate, the additionally received signal includes parity bits which correspond to the second parity check matrix until a code rate applied to the additionally received signal reaches the second code rate, and the additionally received signal includes parity bits which correspond to a parity check matrix concatenated after the third parity check matrix if the code rate applied to the additionally received signal is less than the second code rate.

Preferably, if the first code rate is less than or equal to the second code rate, the additionally received signal includes parity bits which correspond to the second parity check matrix until a code rate applied to the additionally received signal reaches the second code rate, and the additionally received signal includes parity bits which correspond to the third parity check matrix if the code rate applied to the additionally received signal is less than the second code rate.

Preferably, if the first code rate is less than or equal to the second code rate, the additionally received signal includes parity bits which correspond to the third parity check matrix until a code rate applied to the additionally received signal reaches the second code rate, and the additionally received signal includes an inverse order of parity bits which correspond to the second parity check matrix if the code rate applied to the additionally received signal is less than the second code rate.

Preferably, if the first code rate is less than or equal to the second code rate, the additionally received signal includes parity bits which correspond to the third parity check matrix until a code rate applied to the additionally received signal reaches the second code rate, and the additionally received signal includes parity bits which correspond to a parity check matrix concatenated after the third parity check matrix if the code rate applied to the additionally received signal is less than the second code rate.

In accordance with various embodiments of the present disclosure, a receiving apparatus in a communication system supporting an RC-LDPC code is provided. The receiving apparatus includes a processor configured to perform an operation of receiving a signal from a transmitting apparatus, and an operation of performing a decoding operation on the signal corresponding to a first parity check matrix and a first code rate used in the transmitting apparatus, wherein the first parity check matrix includes a second parity check matrix supporting a second code rate, a third parity check matrix supporting a third code rate, a sub-matrix used for concatenating the second parity check matrix and the third parity check matrix, and a fourth parity check matrix shared with the second parity check matrix, the third parity check matrix, and the sub-matrix, and wherein the fourth parity check matrix is a parity check matrix supporting a maximum code rate among code rates supported in the communication system.

Preferably, the second code rate includes a predetermined code rate among the code rates supported in the communication system.

Preferably, if the first code rate is greater than the second code rate and less than or equal to the maximum code rate, the performing of the decoding operation on the signal comprises decoding the signal by considering all parity bits generated corresponding to the third parity check matrix and a part of parity bits generated corresponding to the second parity check matrix which are punctured from the codeword generated based on the first parity check matrix and the first code rate.

Preferably, if the first code rate is less than or equal to the second code rate, the performing of the decoding operation on the signal comprises decoding the signal by considering all parity bits generated corresponding to the second parity check matrix which are punctured from the codeword generated based on the first parity check matrix and the first code rate.

Preferably, if the first code rate is less than or equal to the second code rate, the performing of the decoding operation on the signal comprises decoding the signal by considering all parity bits generated corresponding to the second parity check matrix which are shortened from the codeword generated based on the first parity check matrix and the first code rate.

Preferably, the processor performs detecting that decoding of the transmission signal is failed, additionally receiving a signal from the transmitting apparatus, and performing a decoding operation on the received signal and the additionally received signal.

Preferably, if the first code rate is greater than the second code rate and the first code rate is less than or equal to the maximum code rate, the additionally received signal includes parity bits which correspond to the second parity check matrix until a code rate applied to the additionally received signal reaches the second code rate, and the additionally received signal includes parity bits which correspond to the third parity check matrix if the code rate applied to the additionally received signal is less than the second code rate.

Preferably, if the first code rate is greater than the second code rate and the first code rate is less than or equal to the maximum code rate, the additionally received signal includes parity bits which correspond to the second parity check matrix until a code rate applied to the additionally received signal reaches the second code rate, and the additionally received signal includes parity bits which correspond to a parity check matrix concatenated after the third parity check matrix if the code rate applied to the additionally received signal is less than the second code rate.

Preferably, if the first code rate is less than or equal to the second code rate, the additionally received signal includes parity bits which correspond to the second parity check matrix until a code rate applied to the additionally received signal reaches the second code rate, and the additionally received signal includes parity bits which correspond to the third parity check matrix if the code rate applied to the additionally received signal is less than the second code rate.

Preferably, if the first code rate is less than or equal to the second code rate, the additionally received signal includes parity bits which correspond to the third parity check matrix until a code rate applied to the additionally received signal reaches the second code rate, and the additionally received signal includes an inverse order of parity bits which correspond to the second parity check matrix if the code rate applied to the additionally received signal is less than the second code rate.

Preferably, if the first code rate is less than or equal to the second code rate, the additionally received signal includes parity bits which correspond to the third parity check matrix until a code rate applied to the additionally received signal reaches the second code rate, and the additionally received signal includes parity bits which correspond to a parity check matrix concatenated after the third parity check matrix if the code rate applied to the additionally received signal is less than the second code rate.

In accordance with various embodiments of the present disclosure, a method for receiving a signal in a receiving apparatus in a communication system supporting a rate compatible low density parity check (RC-LDPC) code is provided. The method includes receiving a signal from a transmitting apparatus; and performing a decoding on the signal corresponding to a first parity check matrix and a first code rate used in the transmitting apparatus, wherein the first parity check matrix includes a second parity check matrix supporting a second code rate, a third parity check matrix supporting a third code rate, a sub-matrix used for concatenating the second parity check matrix and the third parity check matrix, and a fourth parity check matrix shared with the second parity check matrix, the third parity check matrix, and the sub-matrix, and wherein the fourth parity check matrix is a parity check matrix supporting a maximum code rate among code rates supported in the communication system.

In accordance with various embodiments of the present disclosure, a receiving apparatus in a in a receiving apparatus in a communication system supporting a rate compatible low density parity check (RC-LDPC) code is provided. The receiving apparatus includes a processor configured to perform: receiving of a signal from a transmitting apparatus, and decoding of the signal corresponding to a first parity check matrix and a first code rate used in the transmitting apparatus, wherein the first parity check matrix includes: a second parity check matrix supporting a second code rate; a third parity check matrix supporting a third code rate; a sub-matrix used for concatenating the second parity check matrix and the third parity check matrix; and a fourth parity check matrix shared with the second parity check matrix, the third parity check matrix, and the sub-matrix, and wherein the fourth parity check matrix is a parity check matrix supporting a maximum code rate among code rates supported in the communication system.

As is apparent from the foregoing description, an embodiment of the present disclosure enables to transmit and receive a signal in a communication system supporting an RC-LDPC code.

An embodiment of the present disclosure enables to transmit and receive a signal thereby enhancing a performance for various code rates in a communication system supporting an RC-LDPC code.

An embodiment of the present disclosure enables to design an RC-LDPC code thereby guaranteeing a performance for various code rates in a communication system supporting an RC-LDPC code.

An embodiment of the present disclosure enables to design a parity check matrix of an RC-LDPC code thereby guaranteeing a performance for various code rates in a communication system supporting an RC-LDPC code.

An embodiment of the present disclosure enables to transmit and receive a signal thereby increasing efficiency of a link adaptation scheme in a communication system supporting an RC-LDPC code.

An embodiment of the present disclosure enables to transmit and receive a signal thereby increasing efficiency of an IR-HARQ scheme in a communication system supporting an RC-LDPC code.

Certain aspects of the present disclosure may also be embodied as computer readable code on a non-transitory computer readable recording medium. A non-transitory computer readable recording medium is any data storage device that can store data, which can be thereafter read by a computer system. Examples of the non-transitory computer readable recording medium include read only memory (ROM), random access memory (RAM), compact disc (CD)-ROMs, magnetic tapes, floppy disks, optical data storage devices, and carrier waves (such as data transmission through the Internet). The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

It can be appreciated that a method and apparatus according to an embodiment of the present disclosure may be implemented by hardware, software and/or a combination thereof. The software may be stored in a non-volatile storage, for example, an erasable or re-writable ROM, a memory, for example, a RAM, a memory chip, a memory device, or a memory integrated circuit (IC), or an optically or magnetically recordable non-transitory machine-readable (e.g., computer-readable), storage medium (e.g., a CD, a DVD, a magnetic disk, a magnetic tape, and/or the like). A method and apparatus according to an embodiment of the present disclosure may be implemented by a computer or a mobile terminal that includes a controller and a memory, and the memory may be an example of a non-transitory machine-readable (e.g., computer-readable), storage medium suitable to store a program or programs including instructions for implementing various embodiments of the present disclosure.

The present disclosure may include a program including code for implementing the apparatus and method as defined by the appended claims, and a non-transitory machine-readable (e.g., computer-readable), storage medium storing the program. The program may be electronically transferred via any media, such as communication signals, which are transmitted through wired and/or wireless connections, and the present disclosure may include their equivalents.

An apparatus according to an embodiment of the present disclosure may receive the program from a program providing device which is connected to the apparatus via a wire or a wireless and store the program. The program providing device may include a memory for storing instructions which instruct to perform a content protect method which has been already installed, information necessary for the content protect method, and the like, a communication unit for performing a wired or a wireless communication with a graphic processing device, and a controller for transmitting a related program to a transmitting/receiving device based on a request of the graphic processing device or automatically transmitting the related program to the transmitting/receiving device.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for transmitting a signal in a transmitting apparatus in a communication system of a rate compatible-low density parity check (RC-LDPC) code for supporting a plurality of code rates, the method comprising:
    encoding information bits based on a first parity check matrix and a first code rate to generate a codeword;
    processing the codeword to generate a transmission signal; and
    transmitting the transmission signal,
    wherein the first parity check matrix comprises:
        a second parity check matrix of a first scheme;
        a third parity check matrix of a second scheme; and
        a fourth parity check matrix shared with the second parity check matrix and the third parity check matrix,
    wherein the fourth parity check matrix is a parity check matrix supporting a maximum code rate among the code rates,
    wherein the first scheme comprises a scheme of obtaining the second parity check matrix from the fourth parity check matrix based on a plurality of code rates which are greater than or equal to a second code rate and less than or equal to the maximum code rate, and
    wherein the second scheme comprises a scheme of obtaining the third parity check matrix from the fourth parity check matrix based on the second code rate.

2. The method of claim 1, wherein, based on the first code rate being greater than the second code rate and being less than or equal to the maximum code rate, the processing of the codeword to generate the transmission signal comprises generating the transmission signal by puncturing all parity bits corresponding to the third parity check matrix and a part of parity bits corresponding to the second parity check matrix from the codeword.

3. The method of claim 1, wherein, based on the first code rate is-being less than or equal to the second code rate, the processing of the codeword to generate the transmission signal comprises generating the transmission signal by puncturing all parity bits corresponding to the second parity check matrix from the codeword.

4. The method of claim 1, wherein, based on the first code rate being less than or equal to the second code rate, the processing of the codeword to generate the transmission signal comprises generating the transmission signal by shortening all parity bits corresponding to the second parity check matrix from the codeword.

5. The method of claim 1, further comprising:
    detecting that a receiving apparatus fails in decoding the transmission signal;
    generating an additional transmission signal; and
    transmitting the additional transmission signal to the receiving apparatus.

6. The method of claim 5, wherein, based on the first code rate being greater than the second code rate and being less than or equal to the maximum code rate, the generating of the additional transmission signal comprises:
    generating parity bits, which correspond to the third parity check matrix, as the additional transmission signal, based on a code rate of the additional transmission signal being less than the second code rate.

7. The method of claim 5, wherein, based on the first code rate being greater than the second code rate and being less than or equal to the maximum code rate, the generating of the additional transmission signal comprises:
    generating parity bits, which correspond to a parity check matrix concatenated after the third parity check matrix, as the additional transmission signal, based on a code rate of the additional transmission signal being less than the second code rate.

8. The method of claim 5, wherein, based on the first code rate being less than or equal to the second code rate, the generating of the additional transmission signal comprises:
    generating parity bits, which correspond to the second parity check matrix, as the additional transmission signal, based on a code rate of the additional transmission signal being less than the second code rate.

9. The method of claim 5, wherein, based on the first code rate being less than or equal to the second code rate, the generating of the additional transmission signal comprises:
    generating parity bits, which correspond in inverse order to the second parity check matrix, as the additional transmission signal, based on a code rate of the additional transmission signal is-being less than the second code rate.

10. The method of claim 5, wherein, based on the first code rate being less than or equal to the second code rate, the generating of the additional transmission signal comprises:
    generating parity bits, which correspond to the third parity check matrix, as the additional transmission signal, until a code rate of the additional transmission signal reaches the second code rate.

11. A transmitting apparatus in a communication system of a rate compatible-low density parity check (RC-LDPC) code for supporting a plurality of code rates, the transmitting apparatus comprising:
    a processor configured to perform:
        encoding of information bits based on a first parity check matrix and a first code rate to generate a codeword,
        processing of the codeword to generate a transmission signal, and
        transmitting of the transmission signal,
    wherein the first parity check matrix comprises:
        a second parity check matrix of a first scheme;
        a third parity check matrix of a second scheme; and
        a fourth parity check matrix shared with the second parity check matrix and the third parity check matrix,
    wherein the fourth parity check matrix is a parity check matrix supporting a maximum code rate among the code rates,
    wherein the first scheme comprises a scheme of obtaining the second parity check matrix from the fourth parity check matrix based on a plurality of code rates which are greater than or equal to a second code rate and less than or equal to the maximum code rate, and
    wherein the second scheme comprises a scheme of obtaining the third parity check matrix from the fourth parity check matrix based on the second code rate.

12. The transmitting apparatus of claim 11, wherein, based on the first code rate being greater than the second code rate and being less than or equal to the maximum code rate, the processing of the codeword to generate the transmission signal comprises generating the transmission signal by puncturing all parity bits corresponding to the third parity check matrix and a part of parity bits corresponding to the second parity check matrix from the codeword.

13. The transmitting apparatus of claim 11, wherein, if based on the first code rate being less than or equal to the second code rate, the processing of the codeword to generate the transmission signal comprises generating the transmission signal by puncturing all parity bits corresponding to the second parity check matrix from the codeword.

14. The transmitting apparatus of claim 11, wherein, based on the first code rate being less than or equal to the second code rate, the processing of the codeword to generate the transmission signal comprises generating the transmission signal by shortening all parity bits corresponding to the second parity check matrix from the codeword.

15. The transmitting apparatus of claim 11, wherein the processor is further configured to perform:
- detecting that a receiving apparatus fails in decoding the transmission signal,
- generating an additional transmission signal, and
- transmitting the additional transmission signal to the receiving apparatus.

16. The transmitting apparatus of claim 15, wherein, based on the first code rate being greater than the second code rate and being less than or equal to the maximum code rate, the generating of the additional transmission signal comprises:
- generating parity bits, which correspond to the third parity check matrix, as the additional transmission signal, based on a code rate of the additional transmission signal being less than the second code rate.

17. The transmitting apparatus of claim 15, wherein, based on the first code rate being greater than the second code rate and being less than or equal to the maximum code rate, the generating of the additional transmission signal comprises:
- generating parity bits, which correspond to a parity check matrix concatenated after the third parity check matrix, as the additional transmission signal, based on a code rate of the additional transmission signal being less than the second code rate.

18. The transmitting apparatus of claim 15, wherein, based on the first code rate is-being less than or equal to the second code rate, the generating of the additional transmission signal comprises:
- generating parity bits, which correspond to the third parity check matrix, as the additional transmission signal, based on a code rate of the additional transmission signal being less than the second code rate.

19. The transmitting apparatus of claim 15, wherein, based on the first code rate being less than or equal to the second code rate, the generating of the additional transmission signal comprises:
- generating parity bits, which correspond in inverse order to the second parity check matrix, as the additional transmission signal, based on a code rate of the additional transmission signal being less than the second code rate.

20. The transmitting apparatus of claim 15, wherein, based on the first code rate being less than or equal to the second code rate, the generating of the additional transmission signal comprises:
- generating parity bits, which correspond to the third parity check matrix, as the additional transmission signal, until a code rate of the additional transmission signal reaches the second code rate.

* * * * *